United States Patent
Baraskar et al.

(10) Patent No.: US 10,811,109 B2
(45) Date of Patent: Oct. 20, 2020

(54) MULTI-PASS PROGRAMMING PROCESS FOR MEMORY DEVICE WHICH OMITS VERIFY TEST IN FIRST PROGRAM PASS

(71) Applicant: SanDisk Technologies LLC, Addison, TX (US)

(72) Inventors: Ashish Baraskar, Santa Clara, CA (US); Ching-Huang Lu, Fremont, CA (US); Vinh Diep, San Jose, CA (US); Yingda Dong, Los Altos, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/233,723

(22) Filed: Dec. 27, 2018

(65) Prior Publication Data

US 2020/0211663 A1 Jul. 2, 2020

(51) Int. Cl.
  *G11C 16/34* (2006.01)
  *G11C 16/10* (2006.01)
  *G11C 16/26* (2006.01)
  *G11C 16/24* (2006.01)
  *G11C 11/56* (2006.01)

(52) U.S. Cl.
  CPC ...... *G11C 16/3427* (2013.01); *G11C 11/5628* (2013.01); *G11C 11/5642* (2013.01); *G11C 16/10* (2013.01); *G11C 16/24* (2013.01); *G11C 16/26* (2013.01); *G11C 16/3459* (2013.01)

(58) Field of Classification Search
  None
  See application file for complete search history.

(56) References Cited

U.S. PATENT DOCUMENTS 6,343,033 B1  1/2002 Parker
7,564,715 B2  7/2009 Mokhlesi
(Continued)

FOREIGN PATENT DOCUMENTS

KR  10-2016-0047667 A  5/2016
WO  WO2016/025167 A1  2/2016

OTHER PUBLICATIONS

International Search Report & The Written Opinion of the International Searching Authority dated Dec. 12, 2019, International Application No. PCT/US2019/047988.
(Continued)

*Primary Examiner* — J. H. Hur
(74) *Attorney, Agent, or Firm* — Vierra Magen Marcus LLP

(57) ABSTRACT

Techniques are provided to reduce neighbor word line interference and charge loss in a multi-pass program operation. In one implementation, the first pass of a multi-pass program operation uses one or more program pulses without performing associated verify tests. The memory cells may be programmed to different intermediate threshold voltage (Vth) distributions in the first program pass. Different bit line voltages can be used to obtain the different intermediate Vth distributions when the single program pulse is applied. In other cases, multiple program pulses are applied without performing verify tests. The intermediate Vth distributions can be provided for the memory cells assigned to the higher data states but not the lower data states, or for memory cells assigned to both the higher and lower data states.

16 Claims, 32 Drawing Sheets

Example 1A

(56) References Cited

U.S. PATENT DOCUMENTS

| | | |
|---|---|---|
| 7,924,587 B2 | 4/2011 | Perlmutter et al. |
| 9,343,141 B2 | 5/2016 | Pang et al. |
| 9,437,305 B2 | 9/2016 | Lu et al. |
| 9,530,504 B2 | 12/2016 | Lei et al. |
| 9,595,317 B2 | 3/2017 | Li et al. |
| 9,767,894 B2 | 9/2017 | Tang et al. |
| 2012/0014184 A1 | 1/2012 | Dutta et al. |
| 2013/0301352 A1* | 11/2013 | Shim .................. G11C 16/0483 365/185.03 |
| 2016/0141301 A1 | 5/2016 | Mokhlesi et al. |
| 2016/0307622 A1 | 10/2016 | Raghunathan et al. |
| 2016/0351253 A1* | 12/2016 | Miccoli .............. G11C 16/0483 |
| 2018/0286483 A1 | 10/2018 | Goda et al. |

OTHER PUBLICATIONS

English Abstract of KR Publication No. KR10-2016-0047667 published May 3, 2016.

U.S. Appl. No. 16/900,015 filed Jun. 12, 2020.

* cited by examiner

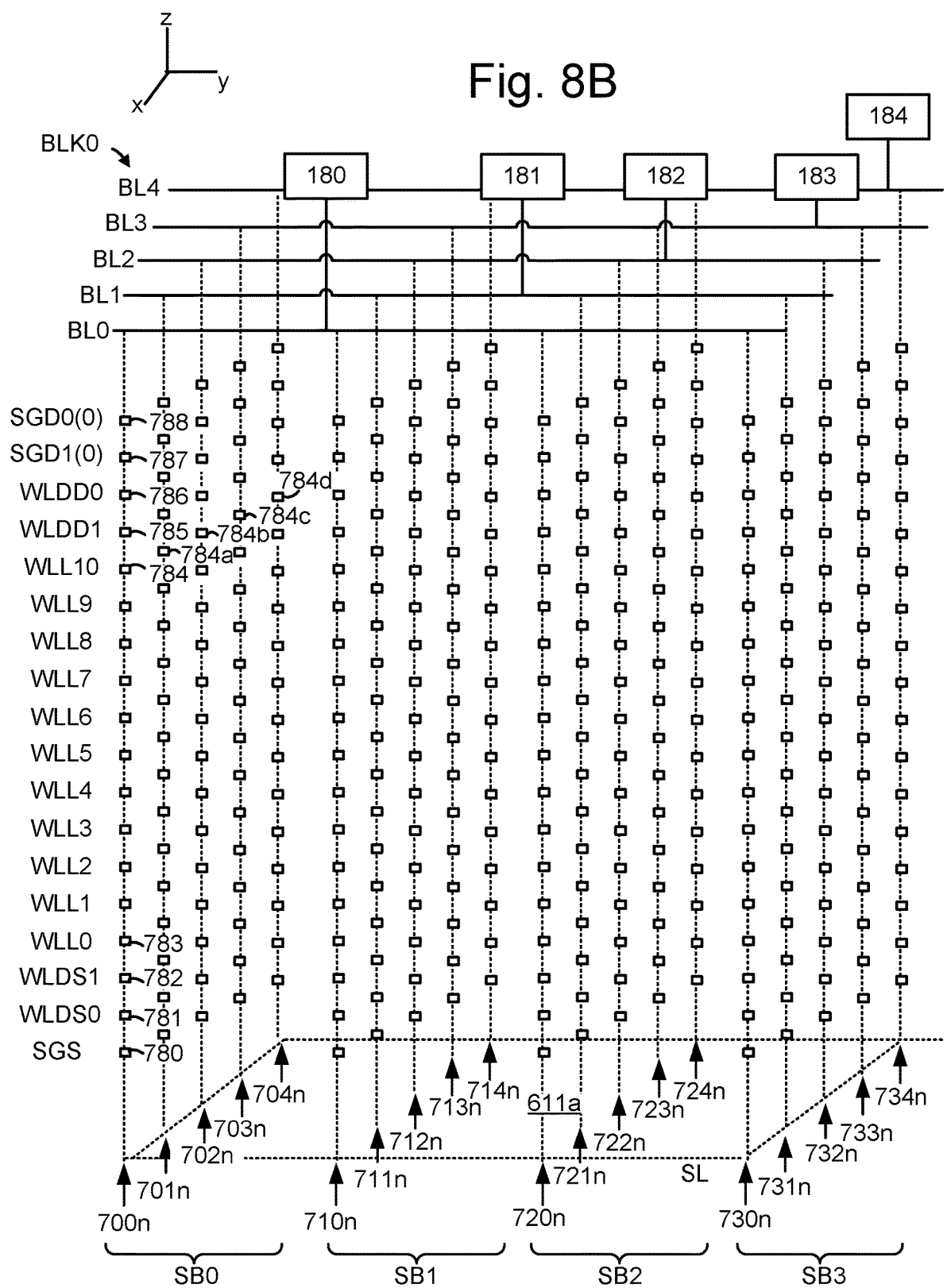

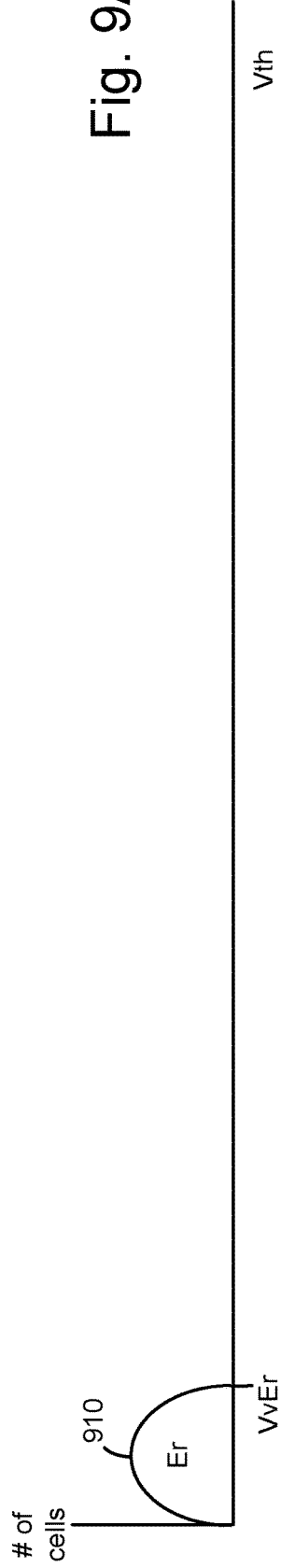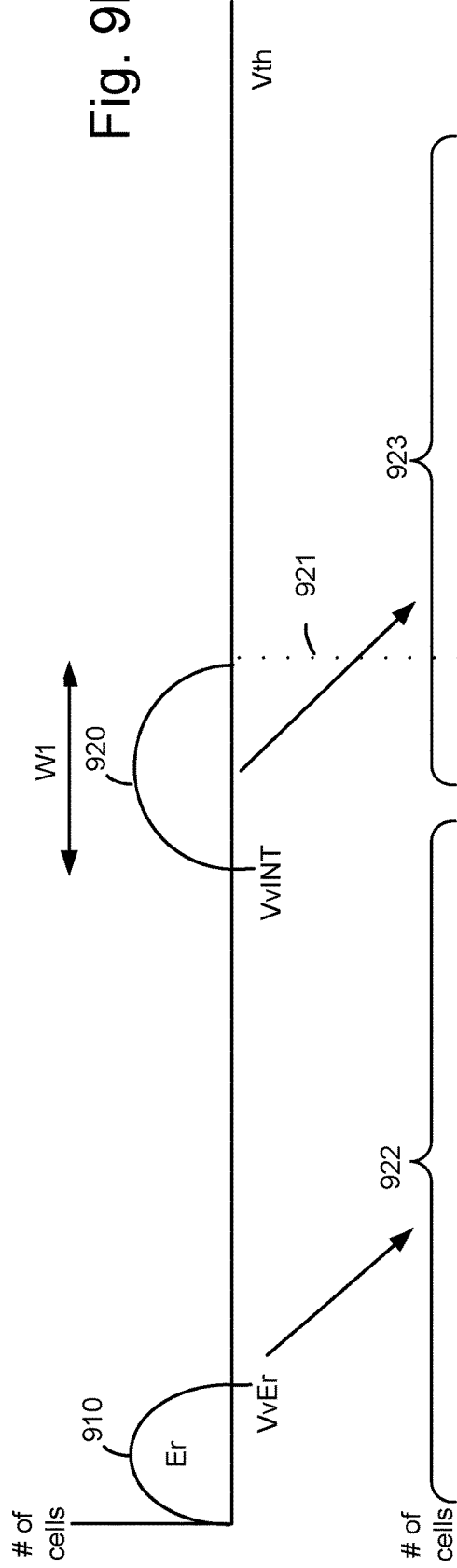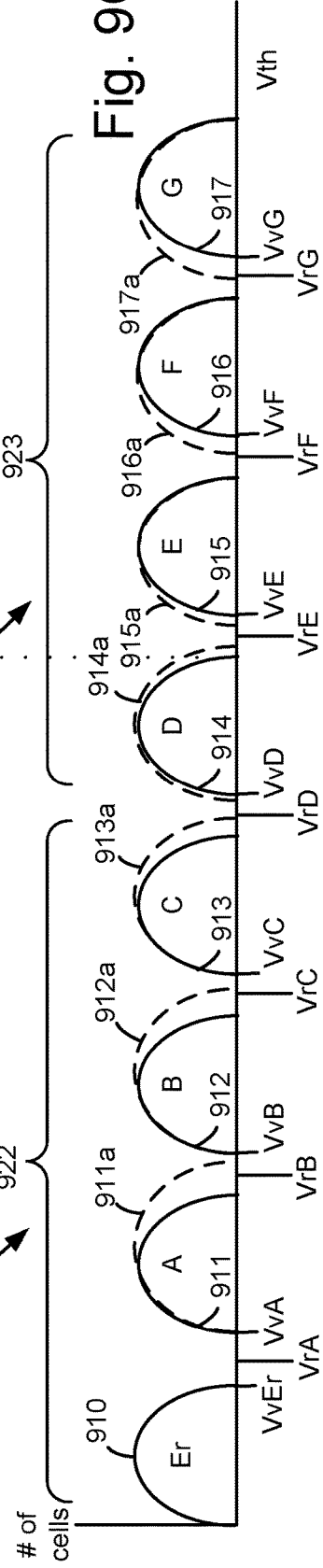

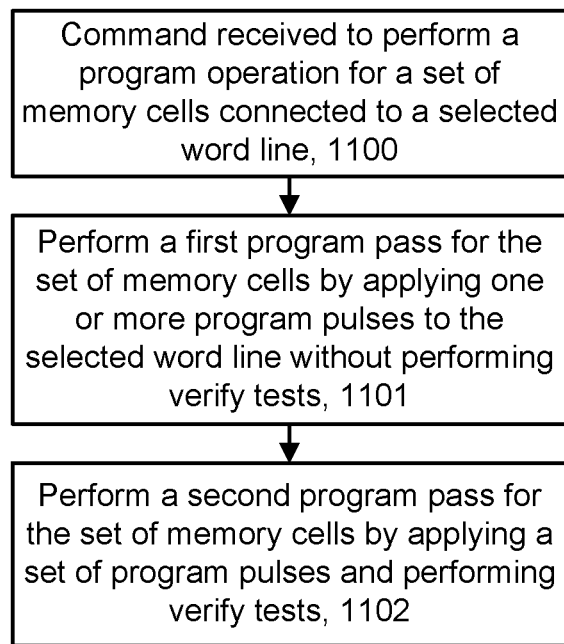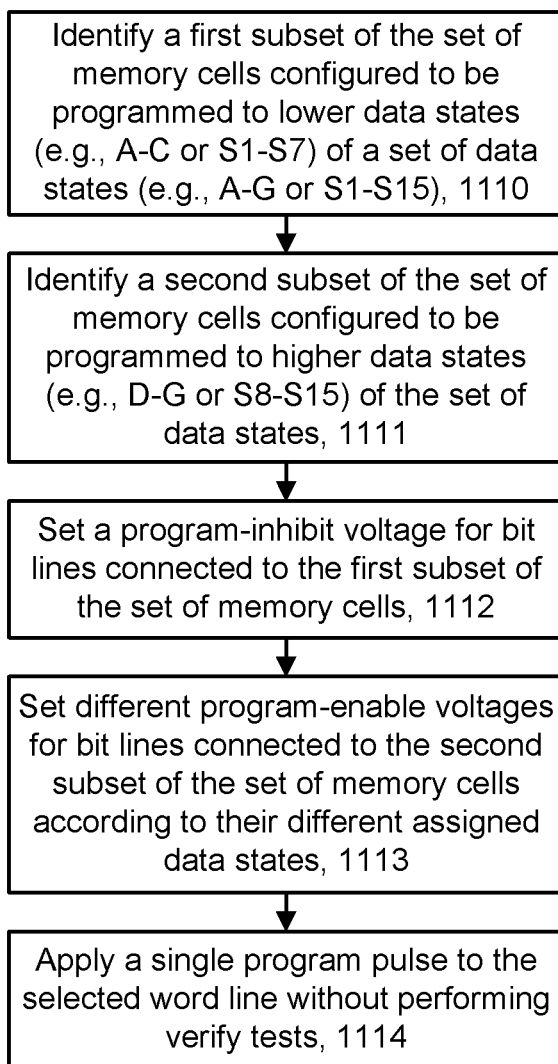

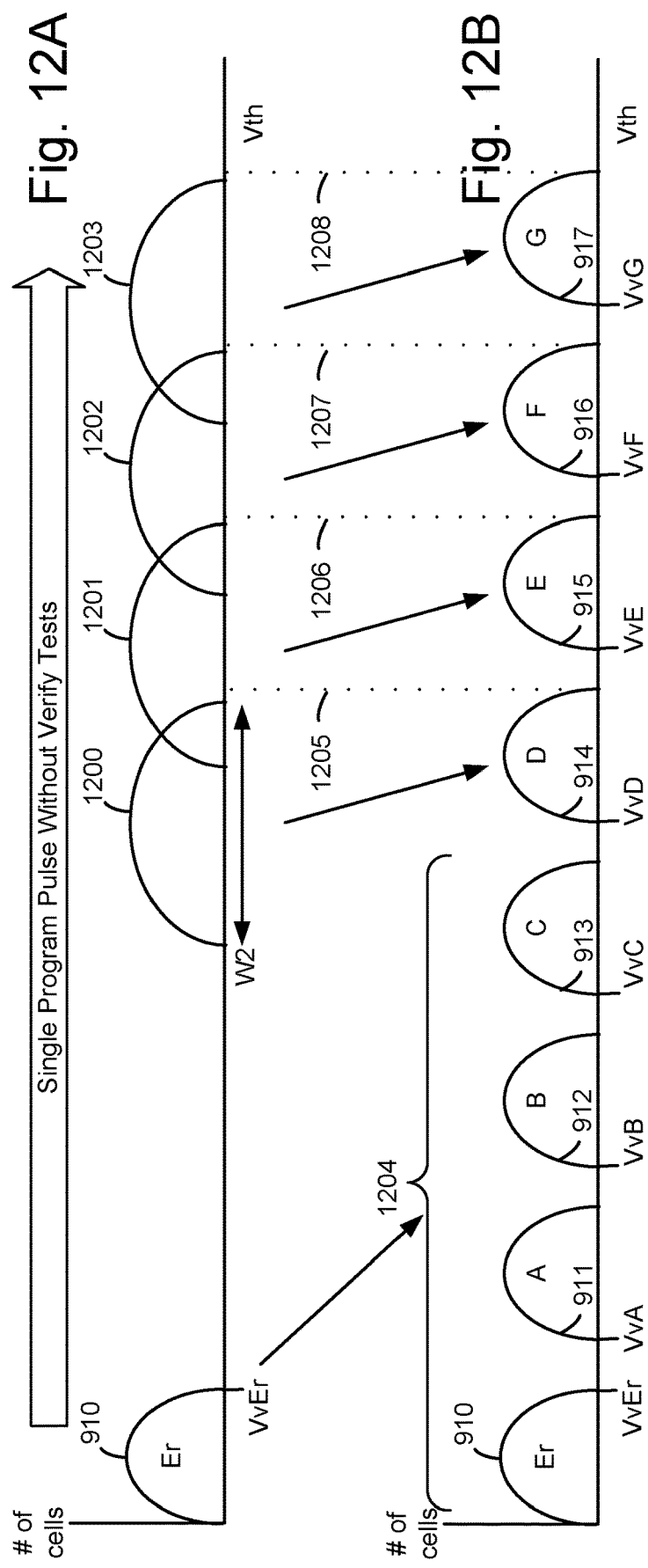

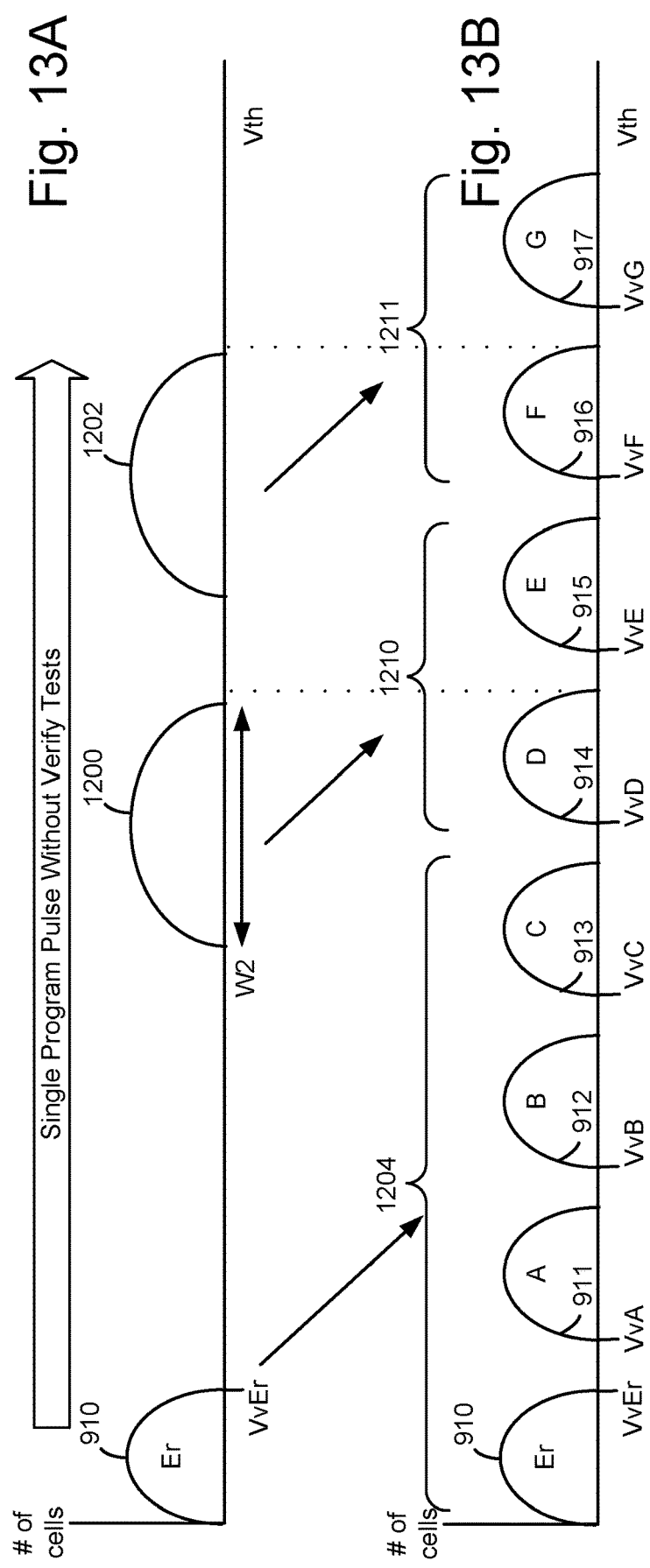

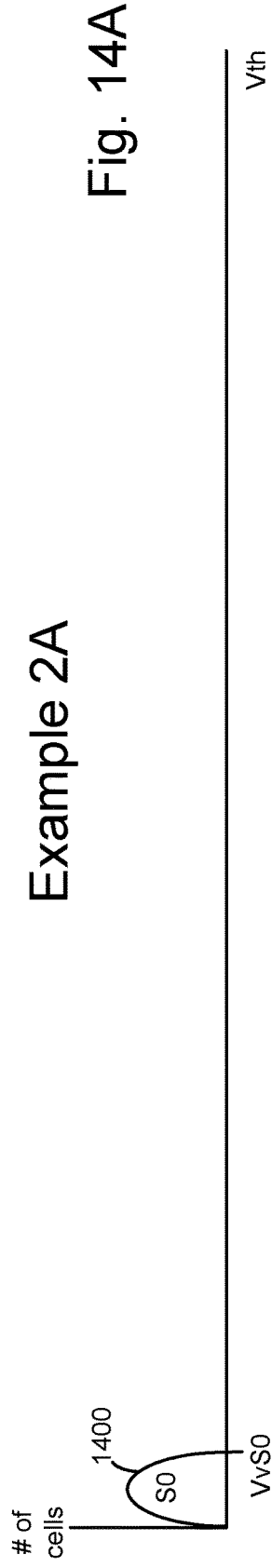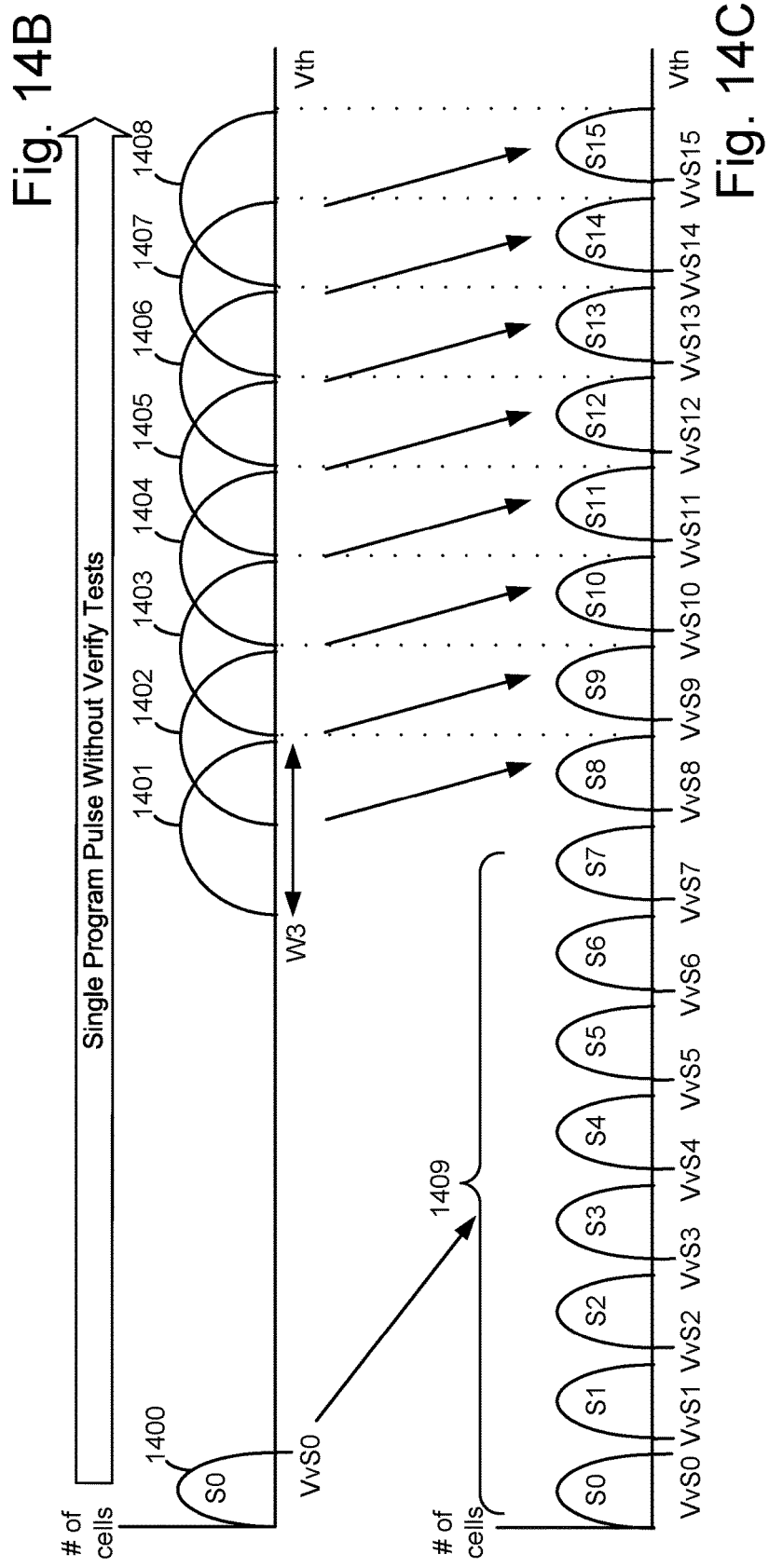

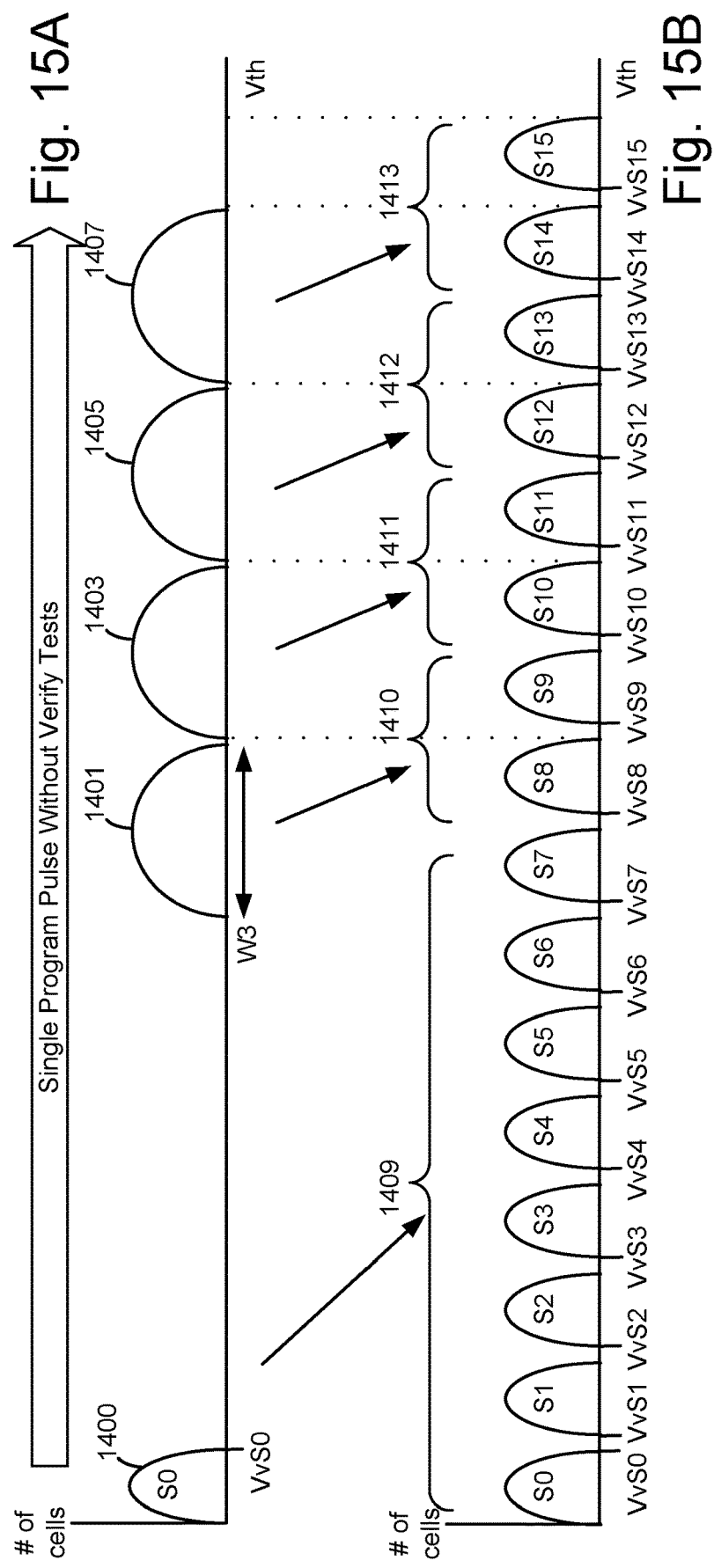

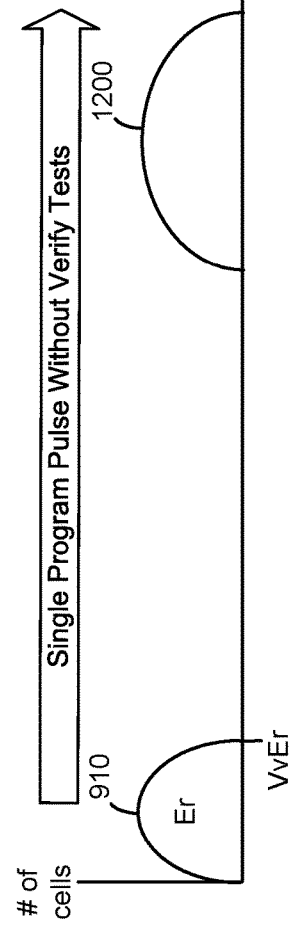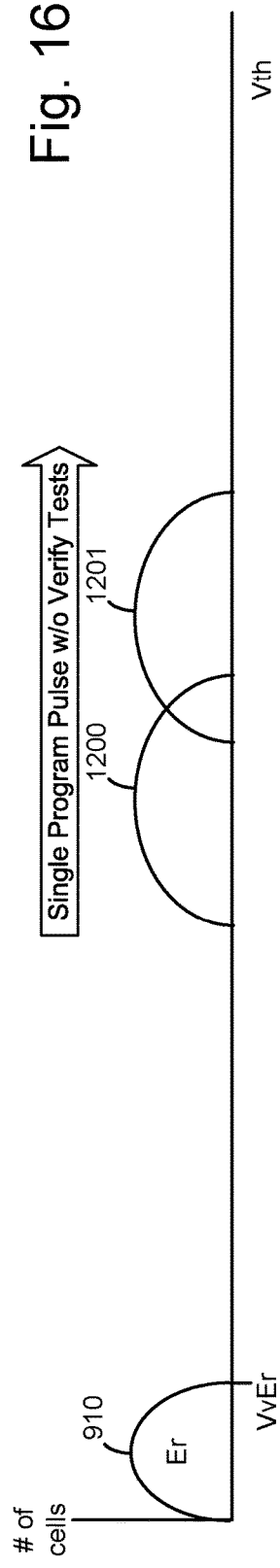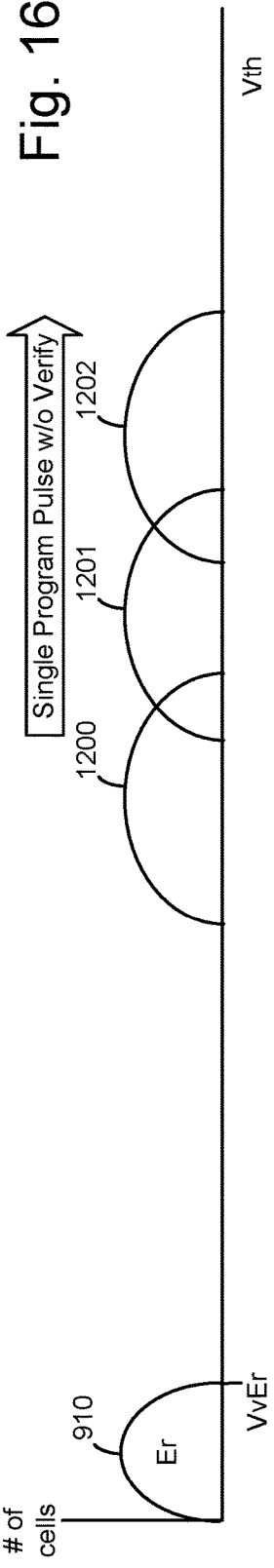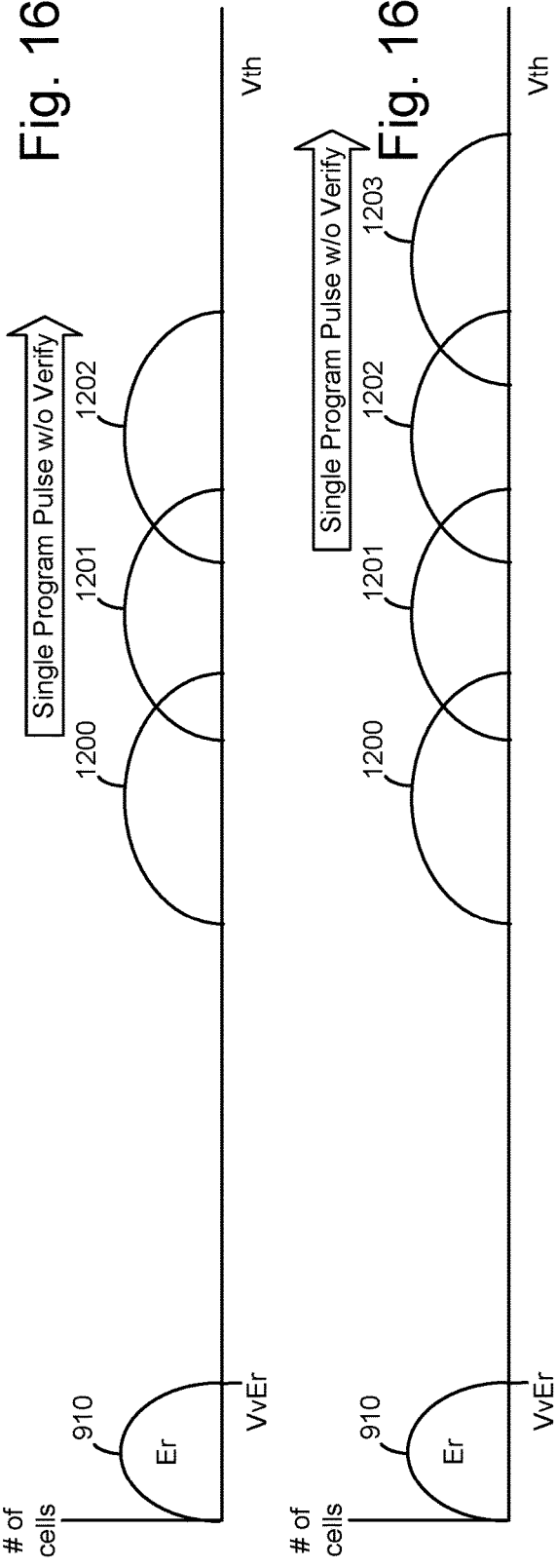

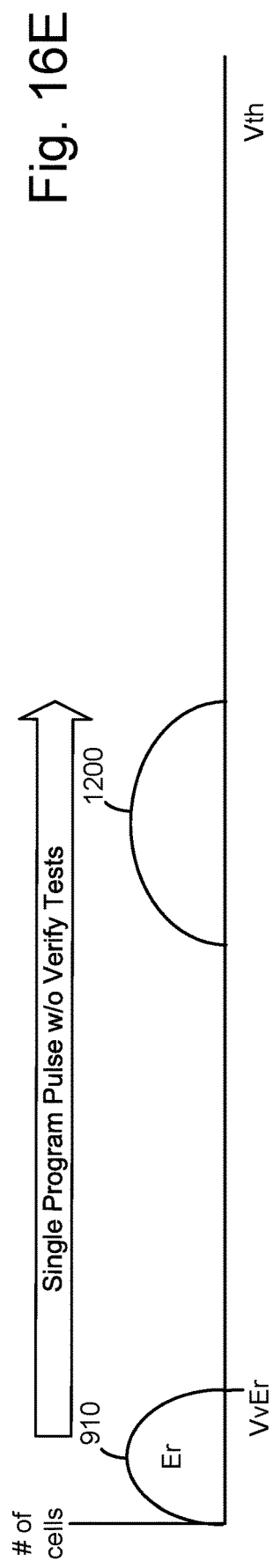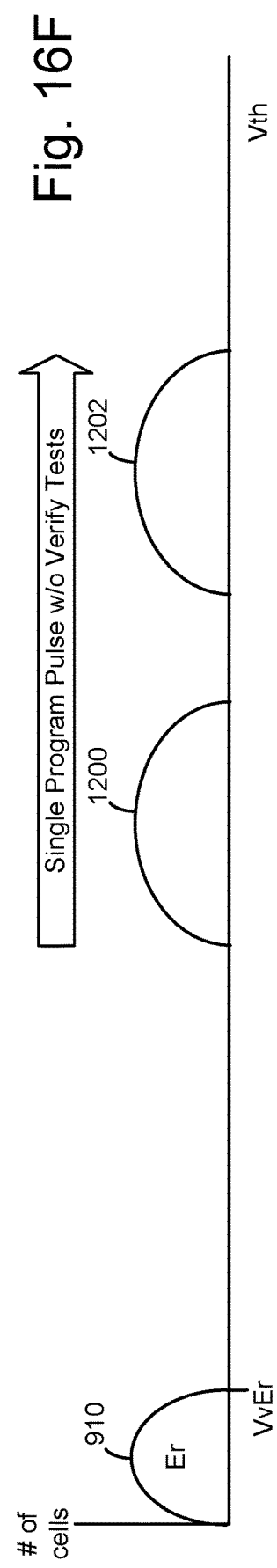

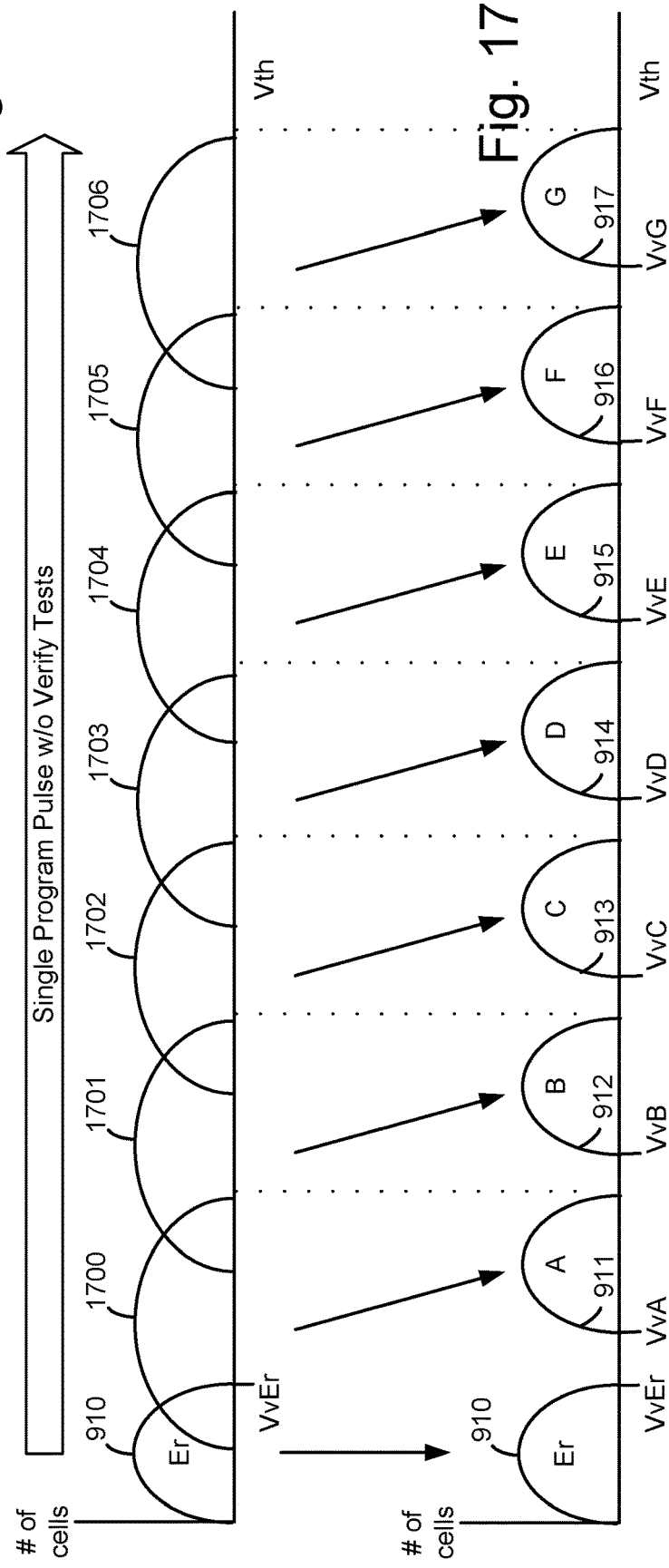

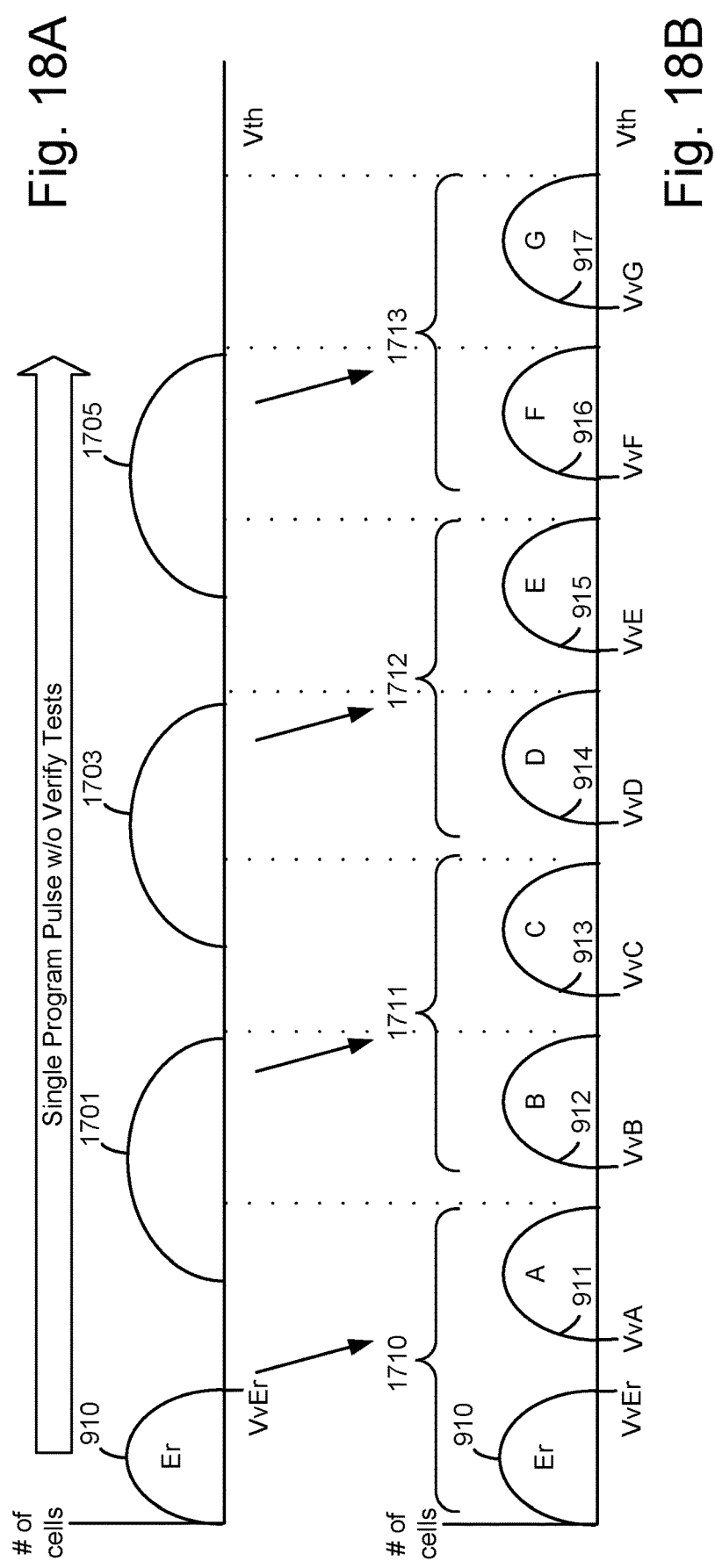

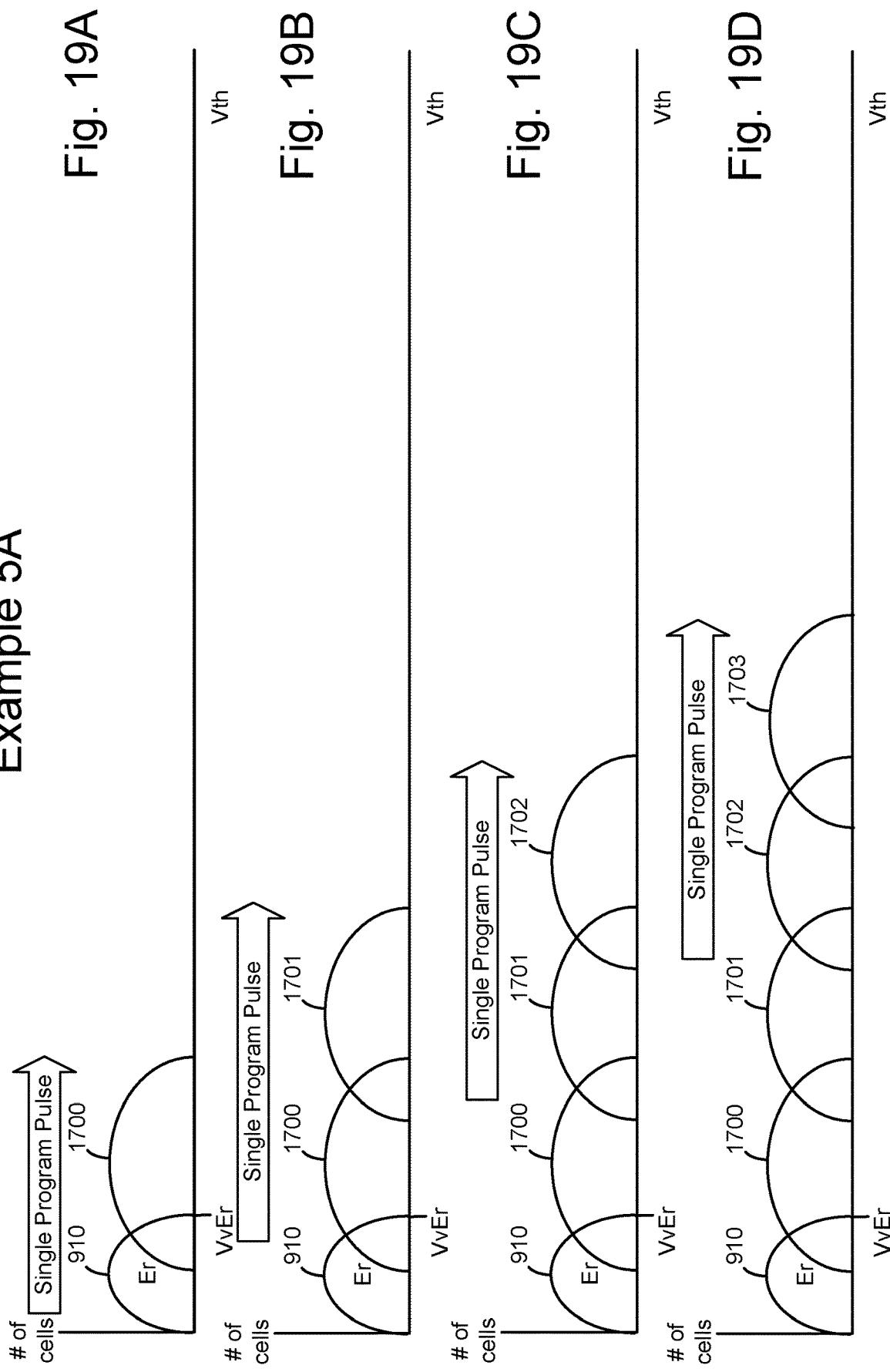

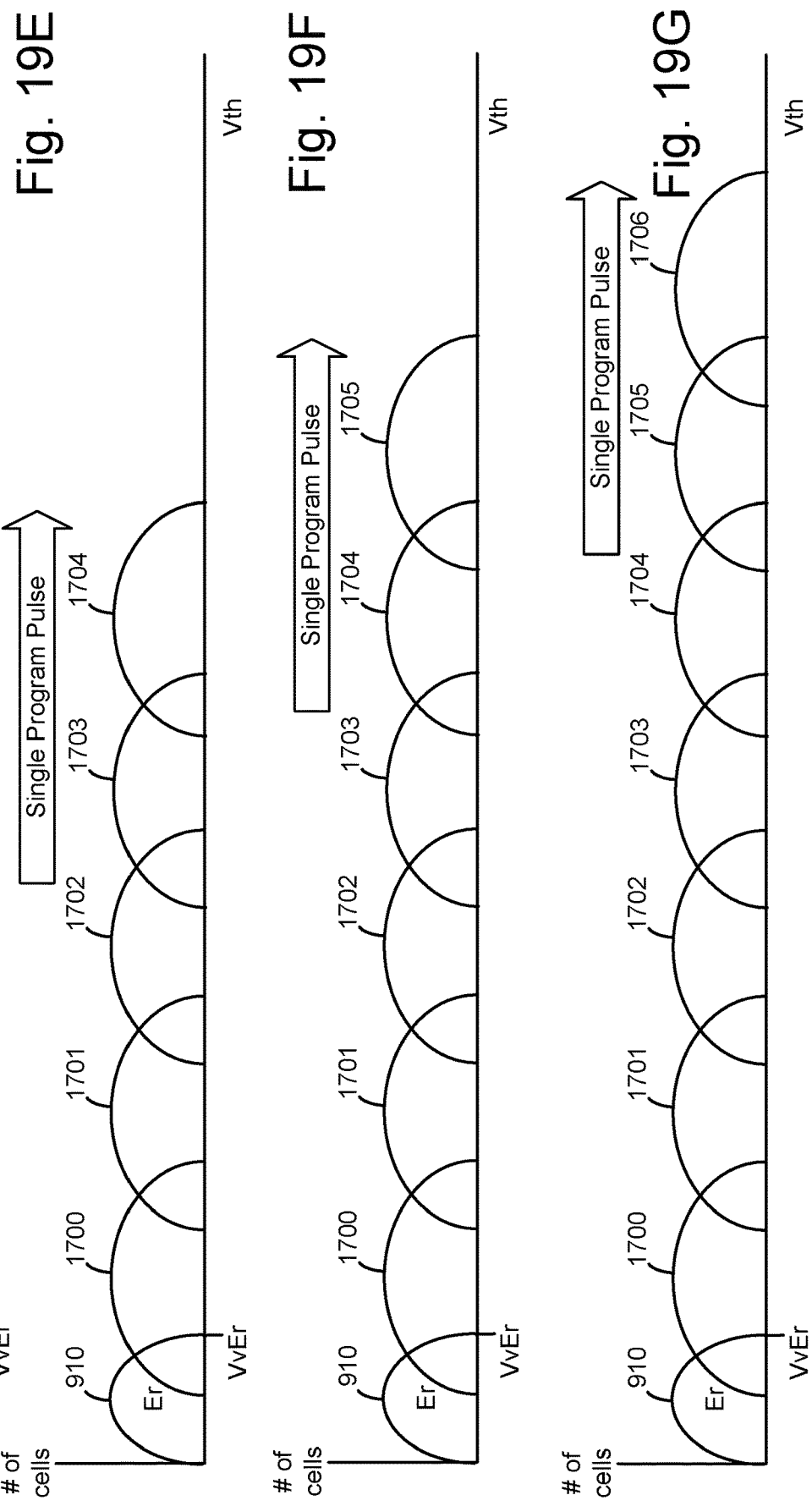

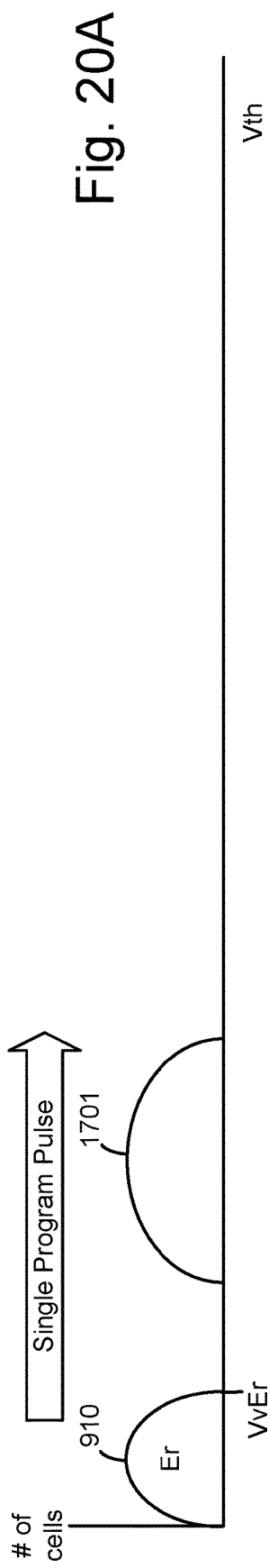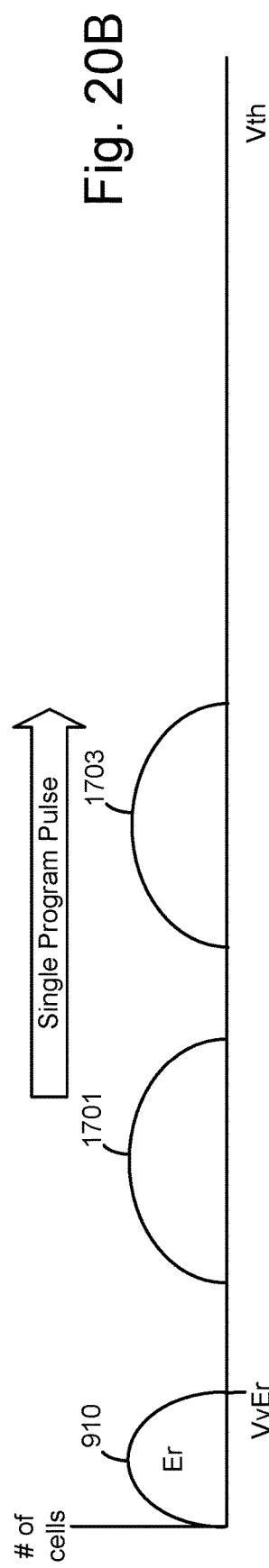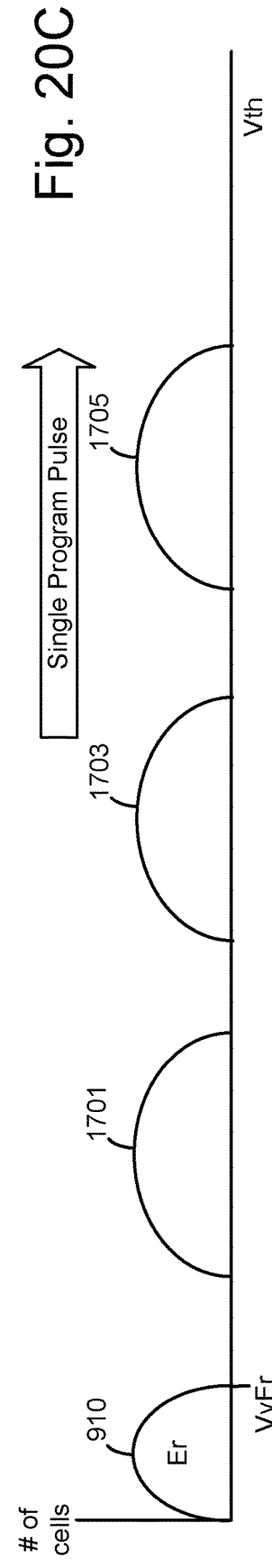

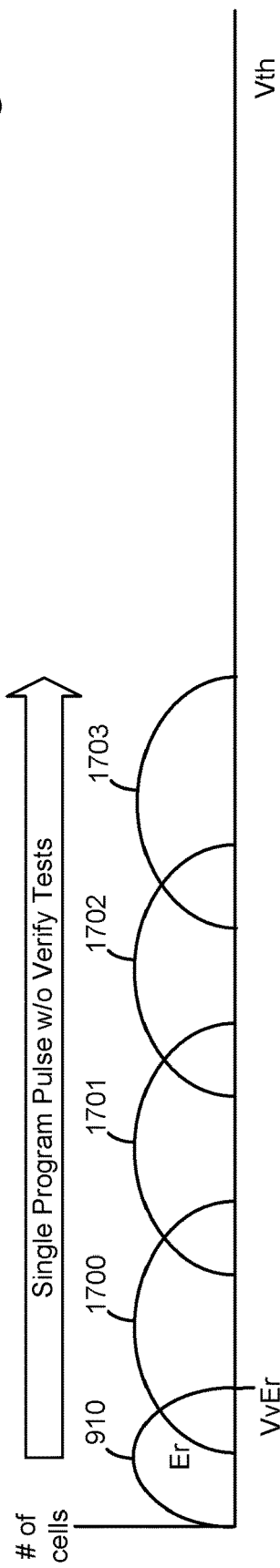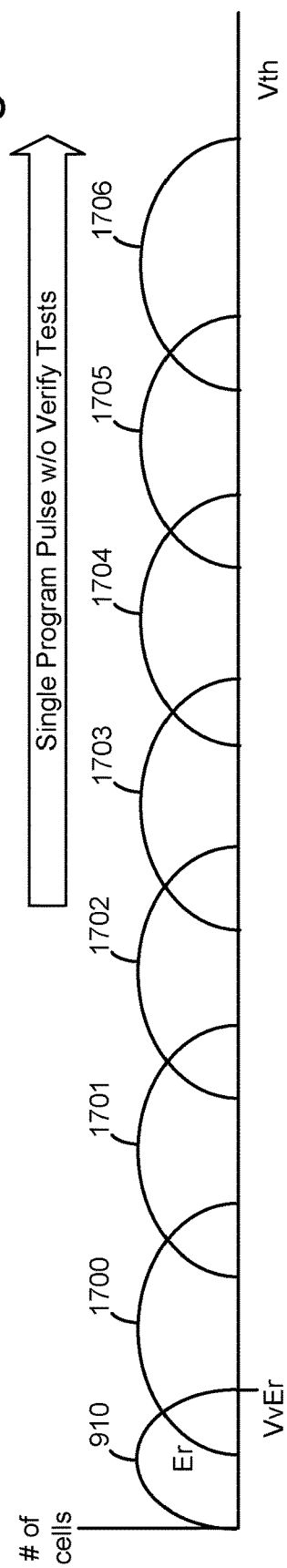

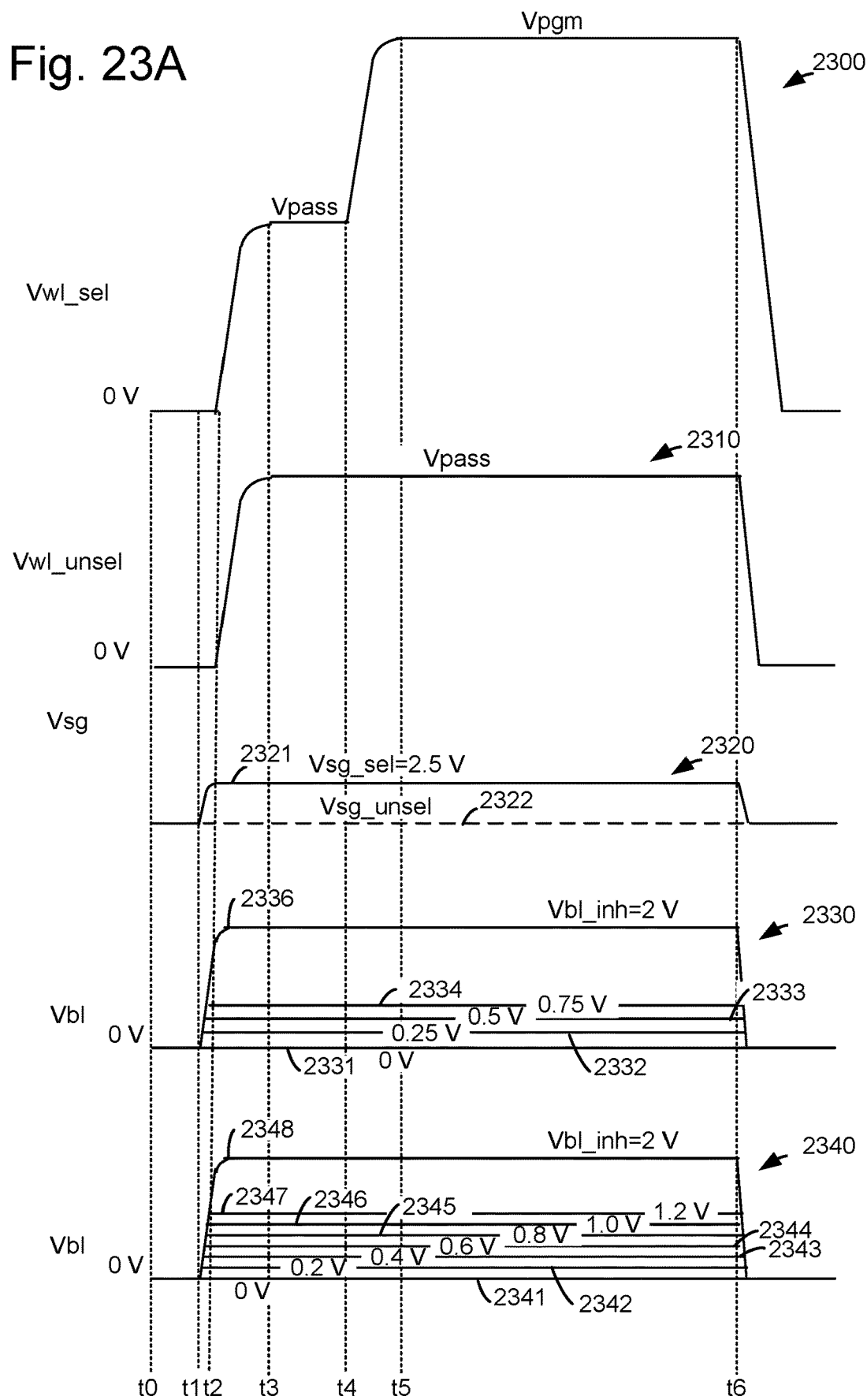

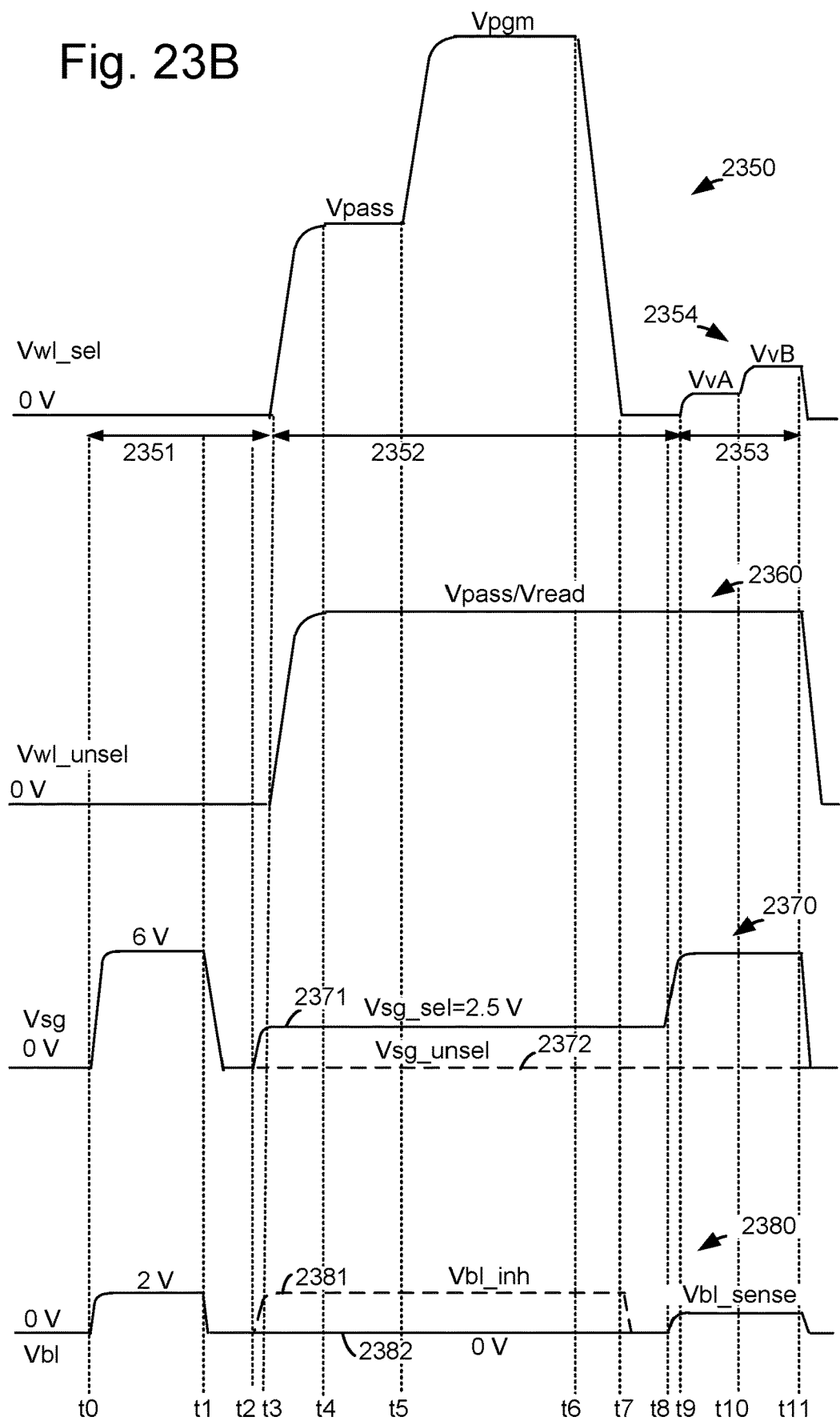

Fig. 24
| Latch: | Er/Inhibit | A | B | C | D | E | F | G |
|---|---|---|---|---|---|---|---|---|
| UDL | 1 | 0 | 0 | 1 | 1 | 0 | 0 | 1 |
| MDL | 1 | 1 | 1 | 0 | 0 | 0 | 1 | 1 |
| LDL | 1 | 1 | 1 | 1 | 0 | 0 | 0 | 0 |
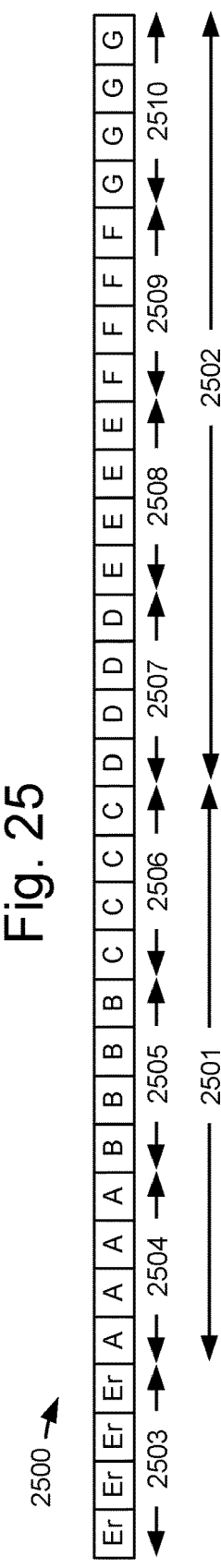
Fig. 25
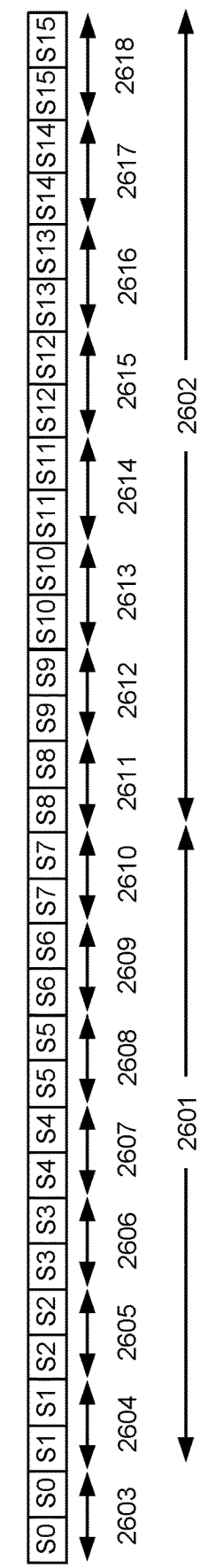
Fig. 26

MULTI-PASS PROGRAMMING PROCESS FOR MEMORY DEVICE WHICH OMITS VERIFY TEST IN FIRST PROGRAM PASS

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance. However, various challenges are presented in operating such memory devices.

BRIEF DESCRIPTION OF THE DRAWINGS

FIG. 8B depicts additional detail of the block BLK0 of FIG. 7.

FIG. 9A depicts a threshold voltage (Vth) distribution of a set of memory cells at the start of a two-pass program operation.

FIG. 9B depicts a Vth distribution of a set of memory cells after the first pass of a two-pass program operation.

FIG. 9C depicts a Vth distribution of a set of memory cells after the second pass of a two-pass program operation.

FIG. 11A depicts a flowchart of an example multi-pass program operation.

FIG. 11B depicts a flowchart of a first example implementation of the first program pass of FIG. 11A.

FIG. 12A depicts a Vth distribution of a set of memory cells after a single program pulse in the first pass of a two-pass program operation, in an Example 1A, where eight data states are used.

FIG. 12B depicts a Vth distribution of a set of memory cells after the second pass of a two-pass program operation, in the Example 1A.

FIG. 13A depicts a Vth distribution of a set of memory cells after a single program pulse in the first pass of a two-pass program operation, in an Example 1B which is an alternative to Example 1A.

FIG. 13B depicts a Vth distribution of a set of memory cells after the second pass of a two-pass program operation, in the Example 1B.

FIG. 14A depicts a Vth distribution of a set of memory cells before the first pass of a two-pass program operation, in an Example 2A, where sixteen data states are used.

FIG. 14B depicts a Vth distribution of a set of memory cells after a single program pulse in the first pass of a two-pass program operation, in the Example 2A.

FIG. 14C depicts a Vth distribution of a set of memory cells after the second pass of a two-pass program operation, in the Example 2A.

FIG. 15A depicts a Vth distribution of a set of memory cells after a single program pulse in the first pass of a two-pass program operation, in an Example 2B which is an alternative to Example 2A.

FIG. 15B depicts a Vth distribution of a set of memory cells after the second pass of a two-pass program operation, in the Example 2B.

FIG. 16A depicts a Vth distribution of a set of memory cells after a first program pulse in the first pass of a two-pass program operation, in an Example 3A, where eight data states are used.

FIG. 16B depicts a Vth distribution of a set of memory cells after a second program pulse in the first pass of a two-pass program operation, in the Example 3A.

FIG. 16C depicts a Vth distribution of a set of memory cells after a third program pulse in the first pass of a two-pass program operation, in the Example 3A.

FIG. 16D depicts a Vth distribution of a set of memory cells after a fourth program pulse in the first pass of a two-pass program operation, in the Example 3A.

FIG. 16E depicts a Vth distribution of a set of memory cells after a first program pulse in the first pass of a two-pass program operation, in an Example 3B which is an alternative to Example 3A.

FIG. 16F depicts a Vth distribution of a set of memory cells after a second program pulse in the first pass of a two-pass program operation, in the Example 3B.

FIG. 17A depicts a Vth distribution of a set of memory cells after a first program pulse in the first pass of a two-pass program operation, in an Example 4A, where eight data states are used.

FIG. 17B depicts a Vth distribution of a set of memory cells after a second pass of a two-pass program operation, in the Example 4A.

FIG. 18A depicts a Vth distribution of a set of memory cells after a single program pulse in the first pass of a two-pass program operation, in an Example 4B which is an alternative to Example 4A.

FIG. 18B depicts a Vth distribution of a set of memory cells after a second pass of a two-pass program operation, in the Example 4B.

FIG. 19A depicts a Vth distribution of a set of memory cells after a first program pulse in the first pass of a two-pass program operation, in an Example 5A, where eight data states are used.

FIG. 19B depicts a Vth distribution of a set of memory cells after a second program pulse in the first pass of a two-pass program operation, in the Example 5A.

FIG. 19C depicts a Vth distribution of a set of memory cells after a third program pulse in the first pass of a two-pass program operation, in the Example 5A.

FIG. 19D depicts a Vth distribution of a set of memory cells after a fourth program pulse in the first pass of a two-pass program operation, in the Example 5A.

FIG. 19E depicts a Vth distribution of a set of memory cells after a fifth program pulse in the first pass of a two-pass program operation, in the Example 5A.

FIG. 19F depicts a Vth distribution of a set of memory cells after a sixth program pulse in the first pass of a two-pass program operation, in the Example 5A.

FIG. 19G depicts a Vth distribution of a set of memory cells after a seventh program pulse in the first pass of a two-pass program operation, in the Example 5A.

FIG. 20A depicts a Vth distribution of a set of memory cells after a first program pulse in the first pass of a two-pass program operation, in an Example 5B as an alternative to Example 5A, where eight data states are used.

FIG. 20B depicts a Vth distribution of a set of memory cells after a second program pulse in the first pass of a two-pass program operation, in the Example 5B.

FIG. 20C depicts a Vth distribution of a set of memory cells after a third program pulse in the first pass of a two-pass program operation, in the Example 5B.

FIG. 21A depicts a Vth distribution of a set of memory cells after a first program pulse in the first pass of a two-pass program operation, in an Example 6, where eight data states are used.

FIG. 21B depicts a Vth distribution of a set of memory cells after a second program pulse in the first pass of a two-pass program operation, in the Example 6.

FIG. 23A depicts example voltage signals which can be used in the first pass of a program operation, consistent with FIG. 11A.

FIG. 23B depicts example voltage signals which can be used in the second pass of a program operation, consistent with FIG. 11A.

FIG. 24 depicts example values in the latches of FIG. 2 during a program operation.

FIG. 25 depicts an example set of memory cells connected to a word line selected for programming, where eight data states are used.

FIG. 26 depicts an example set of memory cells connected to a word line selected for programming, where sixteen data states are used.

DETAILED DESCRIPTION

Figure 1:
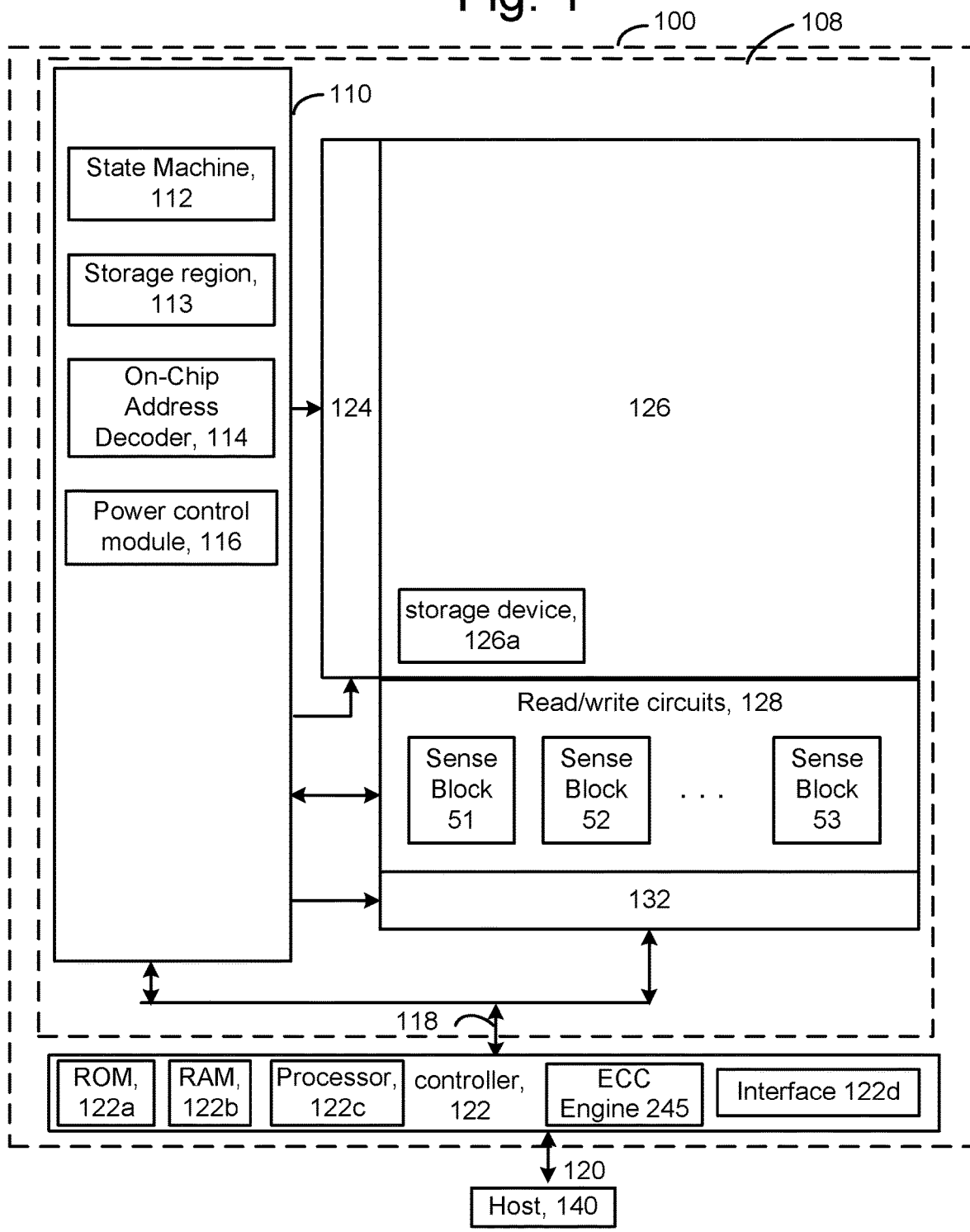
FIG. 1 is a block diagram of an example memory device.

Apparatuses and techniques are described for optimizing a multi-pass program operation in a memory device.

In some memory devices, memory cells are joined to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

In some 3D memory structures, the memory cells are arranged in vertical NAND strings (or other sets of connected memory cells) in a stack, where the stack comprises alternating conductive and dielectric layers. In this structure, the conductive layers act as word lines which are connected to the memory cells. Further, the memory cells may be formed by annular layers of blocking oxide, charge-trapping material, tunnel oxide and channel polysilicon which extend in the stack. The layers may be arranged concentrically. Each NAND string may have the shape of a pillar which intersects with the word lines to form the memory cells.

Each memory cell may be associated with a data state according to write data in a program command. Based on its data state, a memory cell will either remain in the erased state or be programmed to a programmed data state. For example, in a single bit per cell memory device, also referred to as SLC, or single level cell, there are two data states including the erased state and the programmed state. MLC or multi-level cells store two or more bits per cell, as a multiple bit memory cell. For example, in a two-bit per cell memory device, there are four data states including the erased state and three higher data states referred to as the A, B and C data states. In a three-bit per cell memory device, there are eight data states including the erased state and seven higher data states referred to as the A-G data states (see FIG. 9C). In a four-bit per cell memory device, there are sixteen data states including the erased state (S0) and fifteen higher data states, S0-S15 (see FIG. 14C).

Figure 10A:
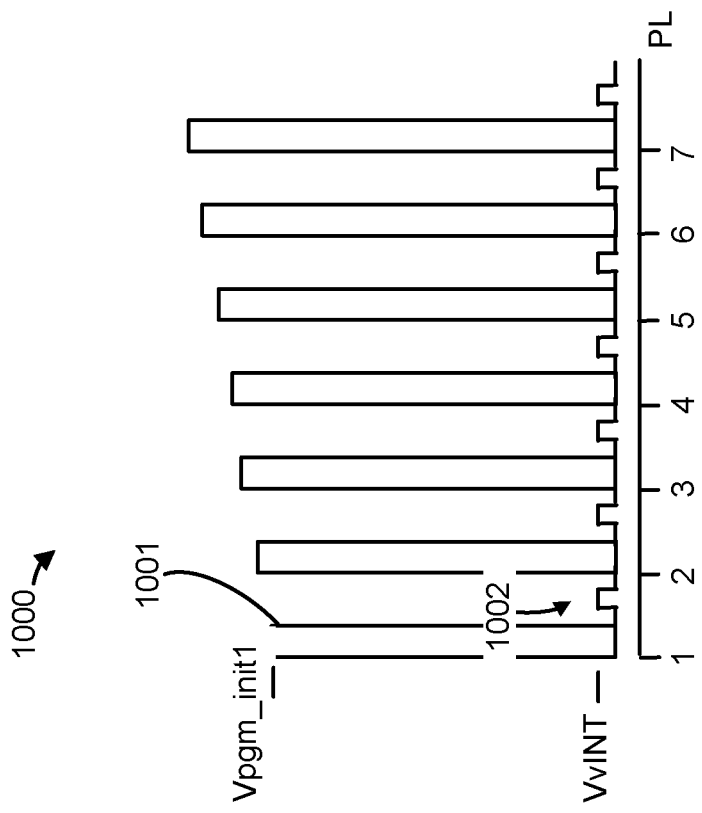
FIG. 10A depicts an example voltage signal used in the first pass of the two-pass program operation of FIG. 9A-9C.
Figure 10B:
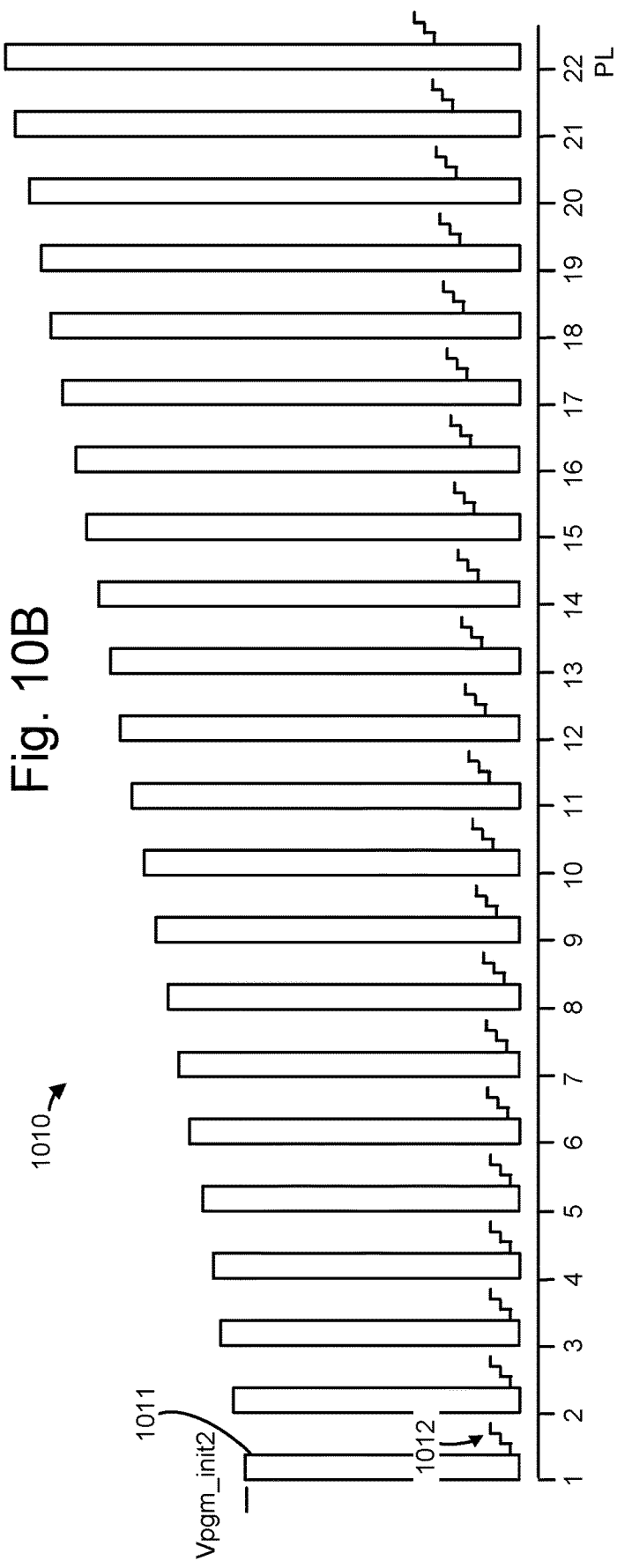
FIG. 10B depicts an example voltage signal used in the second pass of the two-pass program operation of FIG. 9A-9C.

A program operation may use a set of increasing program voltages or pulse which are applied to the word line in respective program loops or program-verify iterations in one or more program passes, such as depicted in FIGS. 10A and 10B.

In some cases, verify tests may be performed after each program voltage to determine whether the memory cells have completed programming. A verify test can involve applying a verify voltage of an assigned data state to the selected word line while sensing circuitry determines whether cells connected to the word line are in a conductive or non-conductive state. As in a read operation, the voltages of the unselected word lines are set to a read pass voltage which is high enough to place the unselected memory cells in a strongly conductive state, to avoid interfering with the sensing of the selected memory cells. If a memory cell is in a non-conductive state, the Vth of the memory cell exceeds the control gate voltage and the memory cell has reached the assigned data state. Programming is thus completed for the memory cell, and it can be locked out from further programming while programming continues for other memory cells in subsequent program loops.

After the memory cells are programmed, the data can be read back in a read operation. A read operation can involve applying a series of read voltages to a word line while sensing circuitry determines whether cells connected to the word line are in a conductive or non-conductive state. If a memory cell is in a non-conductive state, the Vth of the memory cell exceeds the read voltage. The read voltages are set at levels which are expected to be between the threshold voltage levels of adjacent data states. During the read operation, the voltages of the unselected word lines are set at a read pass voltage which is high enough to place the unselected memory cells in a strongly conductive state, to avoid interfering with the sensing of the selected memory cells.

In some cases, multi-pass programming is used, such as where a first program pass is followed by a second program pass. Multi-pass programming has benefits such as reducing neighbor word line interference (NWI). NWI refers to an increase in the Vth of a memory cell connected to one word line when the neighbor (adjacent) memory cell in the same NAND string and connected to another word line is programmed. In particular, when a program voltage is applied to a word line, an electric field is created which draws electrons from the channel layer into a portion of the charge-trapping layer which is adjacent to the word line. However, the electric field includes a fringing or lateral component which can draw electrons from the channel layer into a portion of the charge-trapping layer which is between word lines. Electrons can also move laterally within the charge-trapping layer, resulting in an increase in the Vth of a previously programmed memory cell, also referred to as a victim memory cell. The increase in Vth is greatest when the victim memory cell is programmed to a low data state and therefore has a low Vth, and the later-programmed neighbor memory cell is programmed to a high data state and therefore has a high Vth. NWI results in upshifted and widened Vth distributions for the victim memory cells, such as depicted in FIG. 9C at Vth distributions 911a-914a. Moreover, this problem will become worse as memory devices are scaled down in size and the space between memory cells decreases.

Multi-pass programming reduces NWI by programming the memory cells assigned to higher data states to an intermediate Vth distribution 920, such as depicted in FIG. 9B, in a first program pass. The memory cells assigned to lower data states remain in the erased state Vth distribution 910 in the first program pass. During the subsequent, second program pass, the memory cells assigned to the lower data states are programmed to the final Vth distributions 911-913 from the erased state Vth distribution 910, and the memory cells assigned to the higher data states are programmed to the final Vth distributions 914-917 from the intermediate Vth distribution 920. Additionally, a back and forth word line programming order is used (see FIG. 7) such that when the second program pass is performed on a given word line, e.g., WLL0, the first program pass has already been performed on an adjacent word line, WLL1. As a result, when the second program pass is subsequently performed on the adjacent word line, WLL1, the increase in Vth of the memory cells of WLL1 will be relatively small compared to a single pass program operation, and the NWI of the memory cells of WLL0 will be reduced.

Multi-pass programming combined with the back and forth word line programming order also reduces data retention loss or charge loss. This refers to a downshift in the Vth of the memory cells after they are programmed due to electrons moving out of the charge trapping layer. For example, detrapping can occur at grain boundary traps in a polysilicon channel of a NAND string after programming is completed. Detrapping can also occur at an oxide tunneling layer of a memory cell.

However, there is a time penalty in performing multi-pass programming. For example, FIG. 10A depicts a voltage signal used when several program loops are performed in a first program pass. The voltage signal includes program pulses followed by a verify voltage (VvINT, FIG. 9B) which is used to determine if the memory cells assigned to the higher data states have reached the intermediate Vth distribution. Once the Vth of these memory cells has reached the verify voltage, the first pass is completed.

Techniques provided herein address the above and other issues. In one implementation, the first pass of a multi-pass program operation uses one or more program pulses without performing associated verify tests. Furthermore, the memory cells may be programmed to different intermediate Vth distributions in the first program pass. Different bit line voltages (see FIG. 23A) can be used to obtain the different intermediate Vth distributions when a single program pulse is applied. In other cases, multiple program pulses are applied. The intermediate Vth distributions can be provided for the memory cells assigned to the higher data states but not the lower data states, or for memory cells assigned to both the higher and lower data states. With these techniques, the memory cells are programmed to one or more intermediate Vth distributions in the first program which are close to their final Vth distribution. As a result, the Vth increase of the memory cells between the first and second program passes is reduced, thereby reducing NWI disturb and data retention loss of adjacent victim memory cells.

These and other features are discussed further below.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/ write circuits 128 include multiple sense blocks 51, 52, ... 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116 (power control circuit). The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. The control circuit is configured to program memory cells by applying one or more program pulses to a selected word line, and to apply program-inhibit and program-enable bit line voltages during the program pulses.

For example, a control circuit such as a programming circuit may include any one of, or a combination of, control circuitry 110, state machine 112, decoders 114 and 132, power control module 116, sense blocks 51, 52, ..., 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

The controller 122 or control circuitry 110 can be configured with hardware, firmware and/or software for implementing the techniques described herein.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure. In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
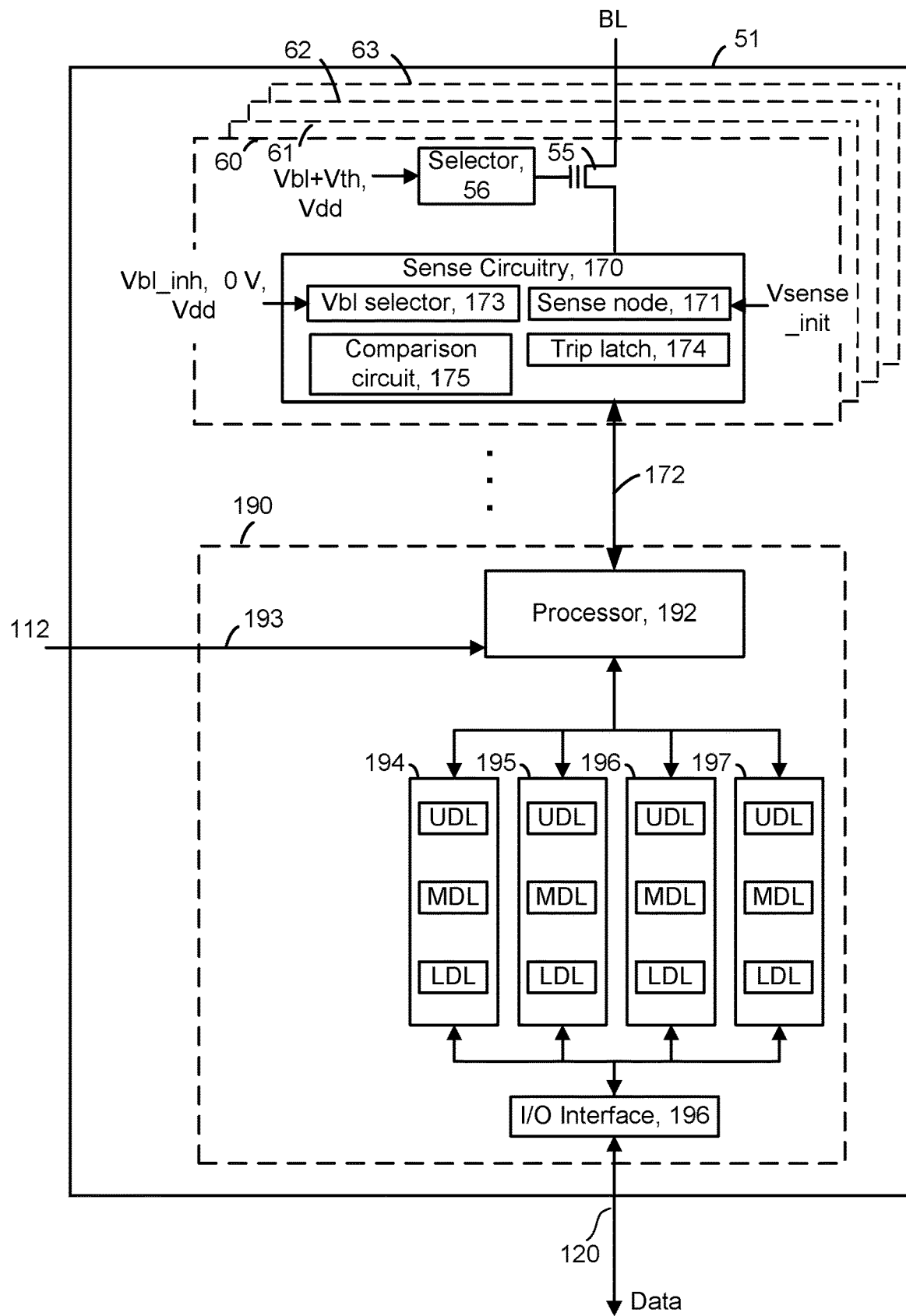
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass a program-inhibit voltage Vbl_inh (e.g., 2 V) to a bit line connected to a memory cell which is inhibited from programmed, or a program-enable voltage, e.g., 0 V, to a bit line connected to a memory cell which is being programmed in the current program loop. A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vth (e.g., 1 V). For example, if Vbl+Vth is passed by the selector 56, the bit line voltage will be Vbl. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits.

During sensing, the sense node 171 is charged up to an initial voltage such as Vsense_init=3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vth is at or below the voltage of the verification signal. If the sense node voltage does not decay below Vtrip, the memory cell is in a non-conductive state and its Vth is above the voltage of the verification signal. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and an I/O Interface 196 coupled between the set of data latches 194 and data bus 120. One set of data latches, e.g., comprising individual latches LDL, MDL and UDL, can be provided for each sense circuit. In some cases, additional data latches may be used. LDL stores a bit for a lower page of data, MDL stores a bit for a lower page of data, and UDL stores a bit for an upper page of data. This is in an eight-level or three-bits per memory cell memory device.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL, MDL and UDL latches, in a three-bit per memory cells implementation.

The program operation, under the control of the state machine, applies a set of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An MDL or UDL latch is flipped when a middle or upper page bit, respectively, is stored in an associated memory cell. This occurs when an associated memory cell completes programming.

Figure 3:
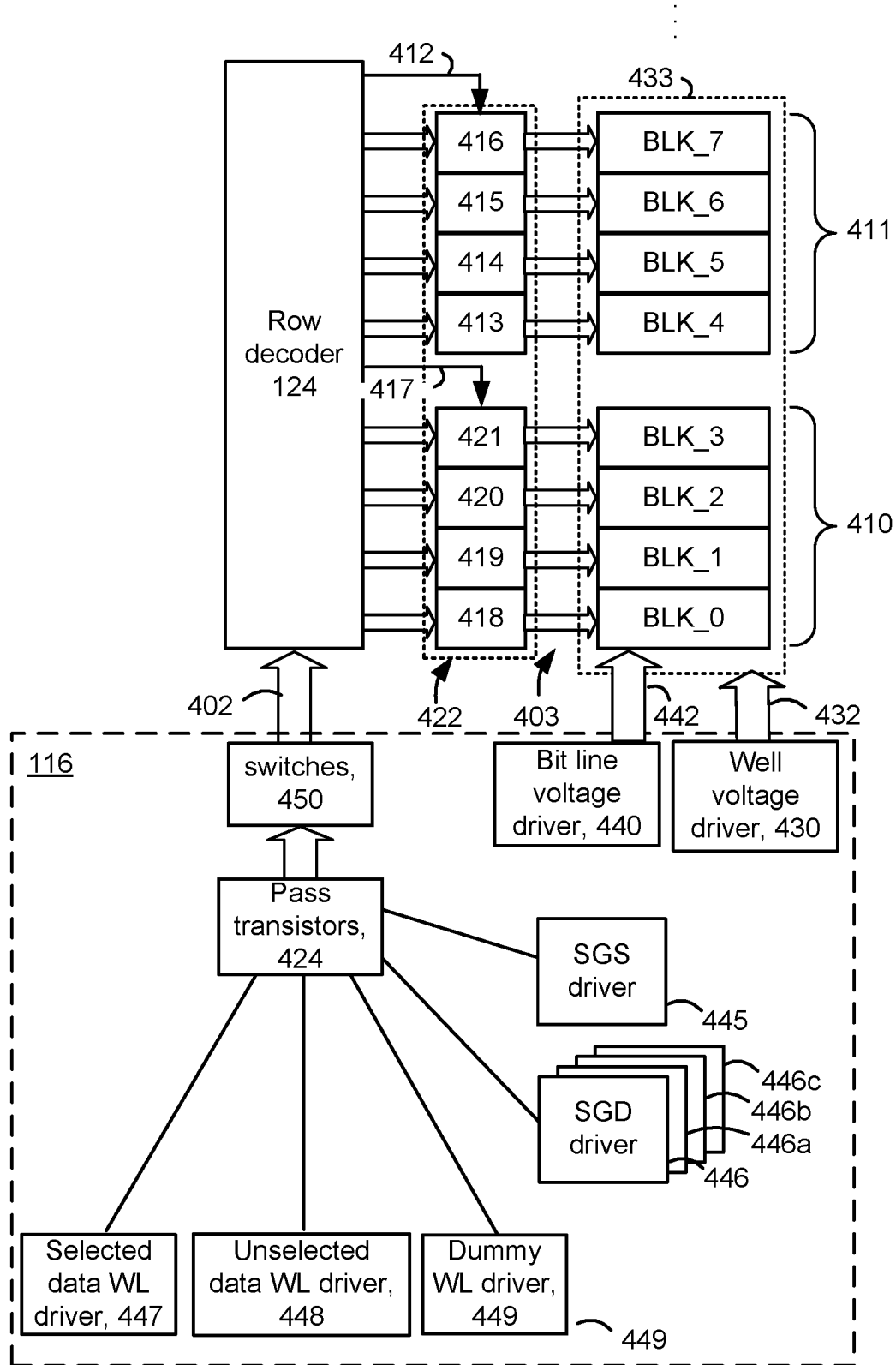
FIG. 3 depicts an example implementation of the power control module 116 of FIG. 1 for providing voltages to blocks of memory cells.

FIG. 3 depicts an example implementation of the power control module 116 of FIG. 1 for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1 provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

Figure 5A:
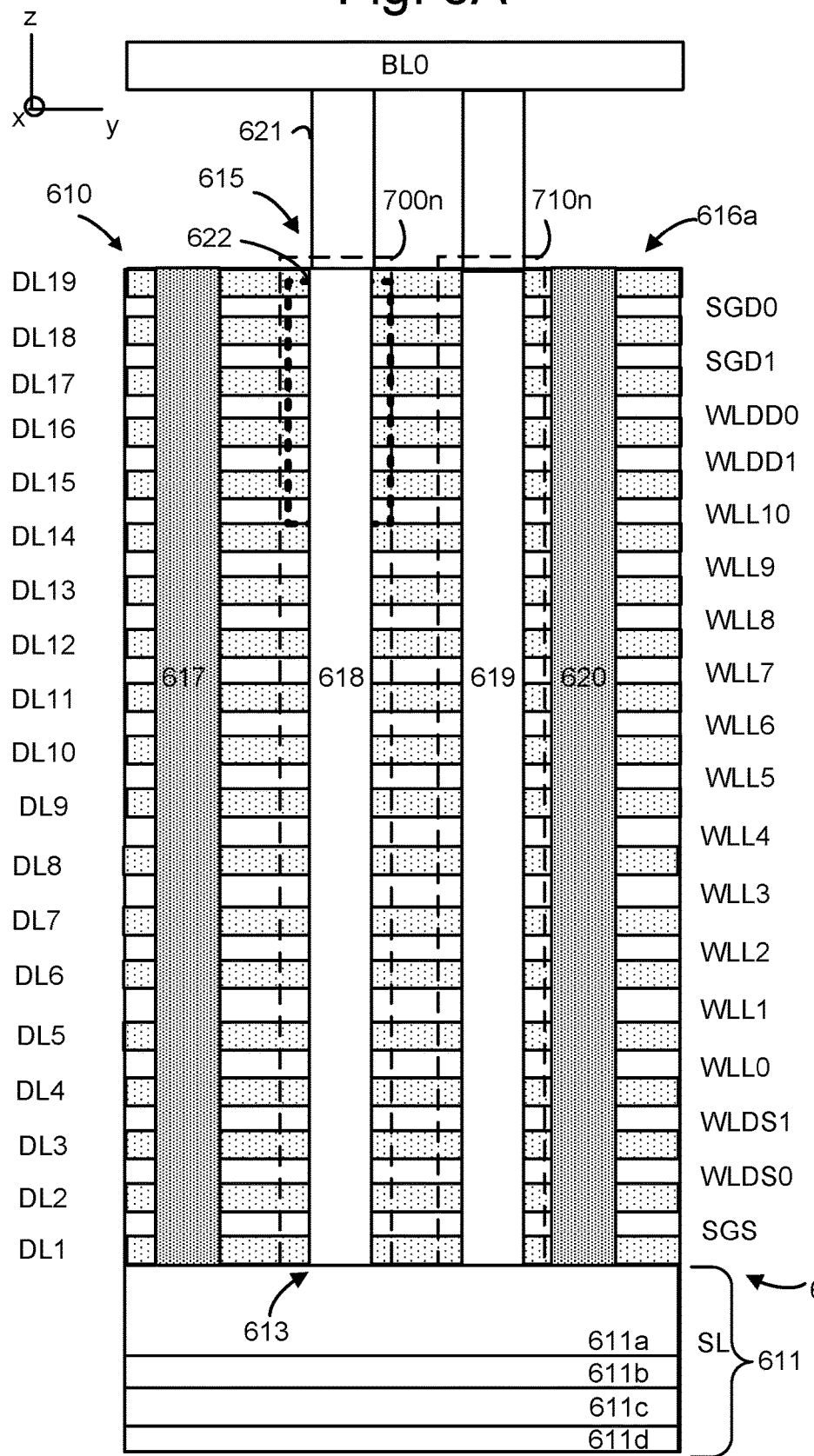
FIG. 5A depicts an example cross-sectional view of a portion of the block BLK0 of FIG. 4.

The voltage drivers can include a selected data word line (WL) driver 447, which provides a voltage on a data word line selected during a program or read operation, a driver 448 for unselected data word lines, and a driver for dummy word lines 449 (e.g., WLDD0, WLDD1, WLDS1 and WLDS0, respectively, in FIG. 5A).

Figure 7:
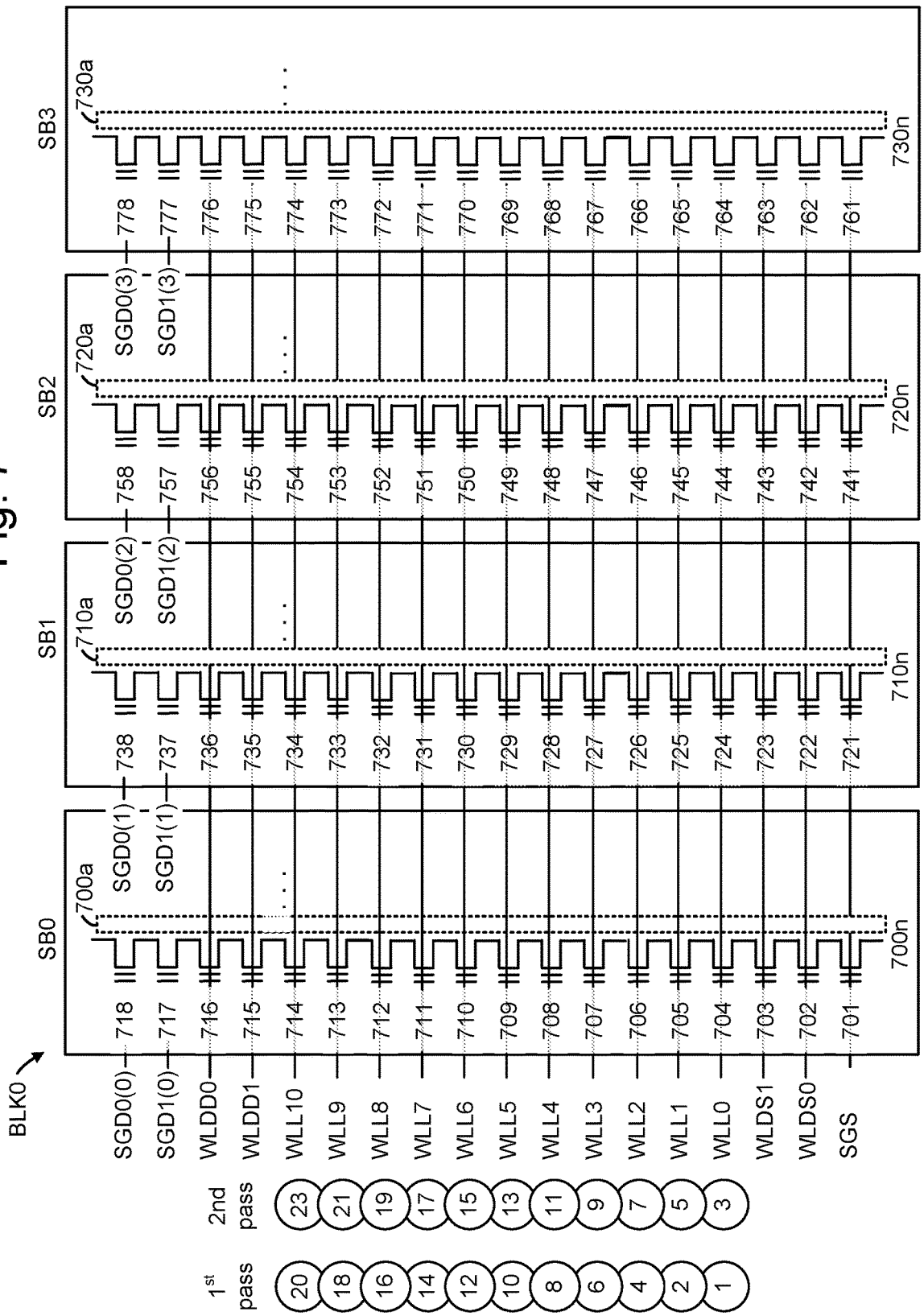
FIG. 7 depicts an example view of NAND strings in a block BLK0 which is consistent with FIGS. 4 and 5A.
Figure 8A:
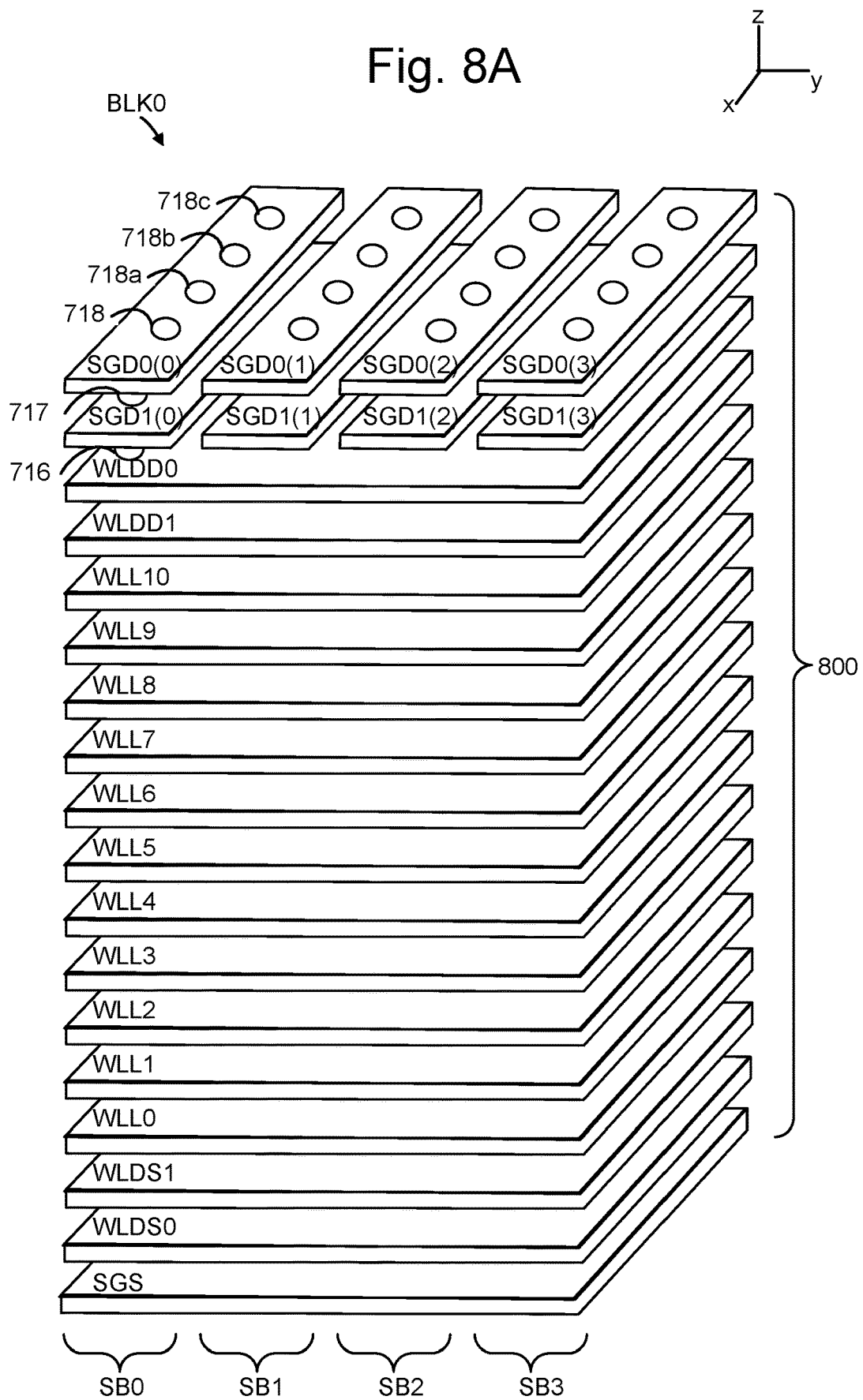
FIG. 8A depicts control gate layers in the block BLK0, consistent with FIG. 7.

The voltage drivers can also include an SGS driver 445 for a block, and separate SGD drivers 446, 446a, 446b and 446c for SB0, SB1, SB2 and SB3, respectively, such as in FIGS. 7, 8A and 8B. Moreover, in some cases, there can be multiple SGD transistors, multiple SGS transistors, multiple drain side dummy memory cells and/or multiple source side dummy memory cells in each NAND string. To provide the greatest flexibility in programming these memory cells and transistors with program voltages or other word line specific parameters, there can be a separate driver for each select gate transistor and dummy memory cell in a NAND string, in one approach.

The various components, including the row decoder, may receive commands from a controller such as the state machine 112 or the controller 122 to perform the functions described herein.

In one approach, the well region 433 is common to the blocks and may be driven by a voltage driver 430 via a path 432. A set of bit lines 442 is also shared by the blocks. A bit line voltage driver 440 provides voltages to the bit lines. In a stacked memory device such as depicted in FIGS. 4 to 8B, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach.

Figure 4:
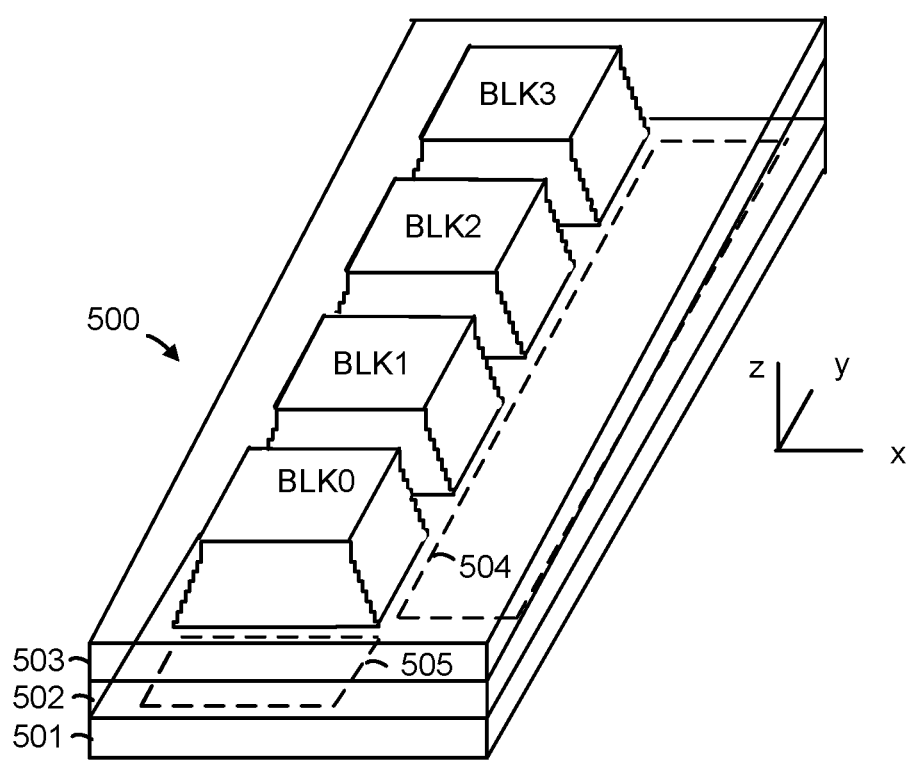
FIG. 4 is a perspective view of a memory device 500 comprising a set of blocks in an example 3D configuration of the memory structure 126 of FIG. 1.

FIG. 4 is a perspective view of a memory device 500 comprising a set of blocks in an example 3D configuration of the memory structure 126 of FIG. 1. On the substrate 501 are example blocks BLK0, BLK1, BLK2 and BLK3 of memory cells and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

FIG. 5A depicts an example cross-sectional view of a portion of the block BLK0 of FIG. 4. The block comprises a stack 610 of alternating conductive and dielectric layers. In this example, the conductive layers comprise two SGD layers, one SGS layer, two source side dummy word line layers (or word lines) WLDS1 and WLDS0, two drain side dummy word line layers WLDD1 and WLDD0, and eleven data word line layers (or data word lines) WLL0-WLL10. WLL0 is a source side data word line and WLDS1 is a dummy word line layer which is adjacent to the source side data word line. WLDS0 is another dummy word line layer which is adjacent to WLDS1. WLL10 is a drain side data word line and WLDD1 is a dummy word line layer which is adjacent to the drain side data word line. WLDD0 is another dummy word line layer which is adjacent to WLDD1. The dielectric layers are labelled as DL1-1L19. Further, regions of the stack which comprise NAND strings 700*n* and 710*n* are depicted. Each NAND string encompasses a memory hole 618 or 619 which is filled with materials which form memory cells adjacent to the word lines. Region 622 of the stack is shown in greater detail in FIG. 6.

The stack includes a substrate 611. In one approach, a portion of the source line SL comprises a well region 611*a* as an n-type source diffusion layer or well in the substrate. The well region is in contact with a source end of each string of memory cells in a block. An erase pulse may be applied to this layer in an erase operation The n-type well region 611*a* is formed in a p-type well region 611*b*, which in turn is formed in an n-type well region 611*c*, which in turn is formed in a p-type semiconductor substrate 611*d*, in one possible implementation. The n-type source diffusion layer may be shared by all of the blocks in a plane, in one approach.

NAND string 700*n* has a source-end 613 at a bottom 616*b* of the stack 616 and a drain-end 615 at a top 616*a* of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

Figure 5B:
FIG. 5B depicts an example transistor 650 in BLK0.

FIG. 5B depicts an example transistor 650 in BLK0. The transistor comprises a control gate CG, a drain D, a source S and a channel CH and may represent a memory cell or a select gate transistor, for example.

Figure 6:
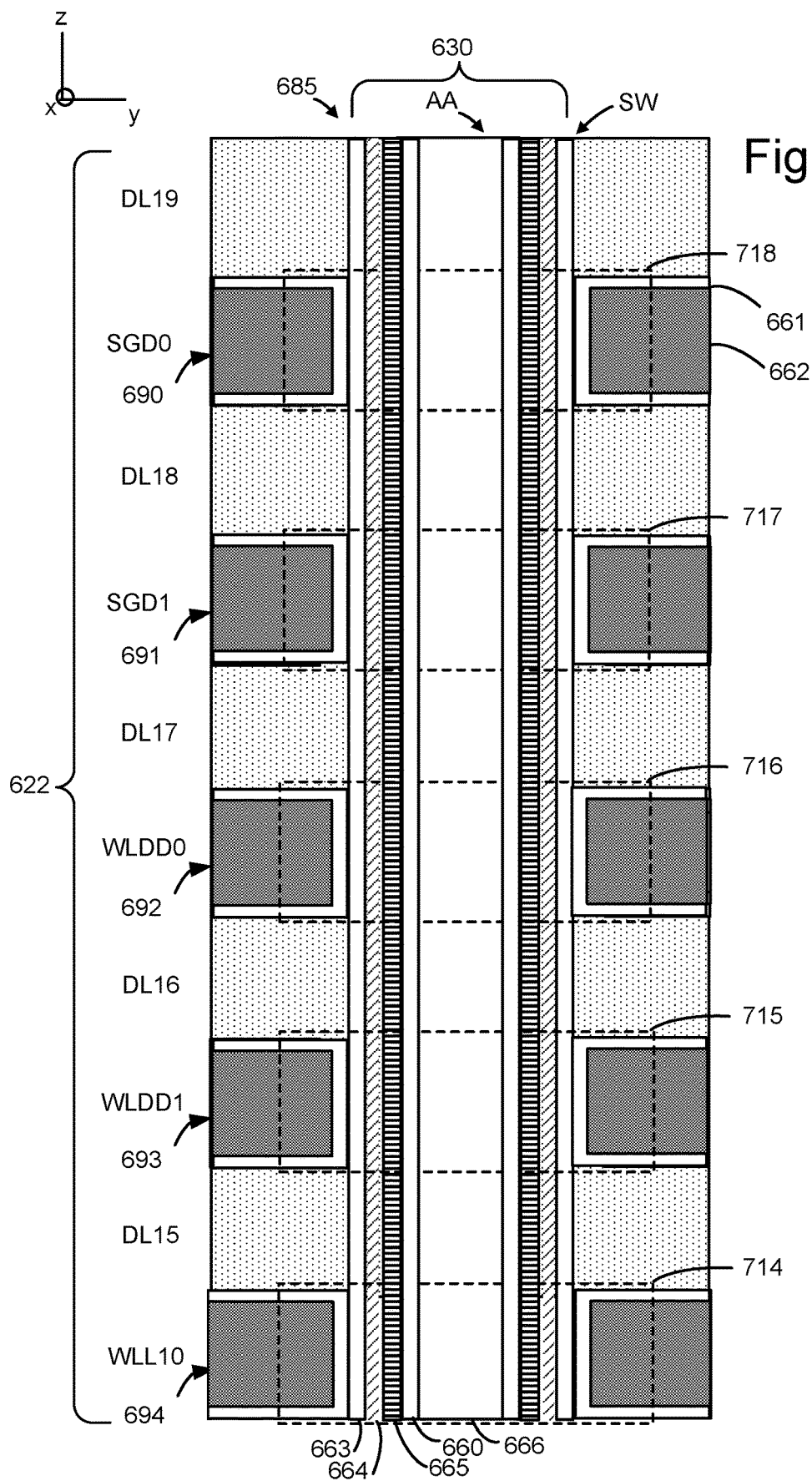
FIG. 6 depicts a close-up view of the region 622 of the stack of FIG. 5A.

FIG. 6 depicts a close-up view of the region 622 of the stack of FIG. 5A. Memory cells are formed at the different levels of the stack at the intersection of a word line layer and a memory hole. In this example, SGD transistors 718 and 717 are provided above dummy memory cells 716 and 715 and a data memory cell 714. These SGD transistors are at the drain end of the NAND string.

A number of layers can be deposited along the sidewall (SW) of the memory hole 630 and/or within each word line layer, e.g., using atomic layer deposition. For example, each pillar 685 or column which is formed by the materials within a memory hole can include a blocking oxide layer 663, a charge-trapping layer 664 or film such as silicon nitride (Si3N4) or other nitride, a tunneling layer 665 (e.g., comprising a gate oxide which may degrade over time), a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700*a*, 710*a*, 720*a* and 730*a* extend continuously in the NAND strings 700*n*, 710*n*, 720*n* and 730*n*, respectively. The channel 700*a* extends continuously in the NAND strings 700*n* from the SGS transistor 701 to the SGD transistors 717 and 718. The channel 700*a* is continuous in that it is uninterrupted and can therefore provide a continuous conductive path in the NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 7 depicts an example view of NAND strings in the block BLK0 which is consistent with FIGS. 4 and 5A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700*n*, 710*n*, 720*n* and 730*n*, respectively. The NAND strings have data word lines, dummy word lines and select gate lines consistent with FIG. 5A. Each sub-block comprises a set of NAND strings which extend in the x direction and which have a common SGD line or control gate layer. The NAND strings 700*n*, 710*n*, 720*n* and 730*n* are in sub-blocks SB0, SB1, SB2 and SB3, respectively. Programming of the block may occur based on a word line programming order. One option is to program all of the memory cells in one sub-block before programming the memory cells of the next sub-block. The word line programming order may start at WL0, the source-end word line and end at WLL10, the drain-end word line, for example.

Furthermore, a back and forth word line programming order may be used, as depicted by the numbered circles next to the word lines. The numbers range from 1-23 and are arranged in first and second columns which denote the first and second program passes, respectively. For example, "1" denotes the first program pass for WLL0, "2" denotes the first program pass for WLL1, "3" denotes the first second program pass for WLL0, "4" denotes the first program pass for WLL2, and so forth. In this case, the two program passes for a word line are interrupted by a program pass on one or both adjacent word lines.

The NAND strings 700*n*, 710*n*, 720*n* and 730*n* have channels 700*a*, 710*a*, 720*a* and 730*a*, respectively.

Additionally, NAND string 700*n* includes SGS transistor 701, dummy memory cells 702 and 703, data memory cells 704-714, dummy memory cells 715 and 716, and SGD transistors 717 and 718.

NAND string 710*n* includes SGS transistor 721, dummy memory cells 722 and 723, data memory cells 724-734, dummy memory cells 735 and 736, and SGD transistors 737 and 738.

NAND string 720n includes SGS transistor 741, dummy memory cells 742 and 743, data memory cells 744-754, dummy memory cells 755 and 756, and SGD transistors 757 and 758.

NAND string 730n includes SGS transistor 761, dummy memory cells 762 and 763, data memory cells 764-774, dummy memory cells 775 and 776, and SGD transistors 777 and 778.

One or more SGD transistors are provided at the drain-end of each NAND string, and one or more SGS transistors are provided at the source-end of each NAND string. The SGD transistors in SB0, SB1, SB2 and SB3 may be driven by separate control lines SGD0(0) and SGD1(0), SGD0(1) and SGD1(1), SGD0(2) and SGD1(2), and SGD0(3) and SGD1(3), respectively, in one approach. In another approach, all of the SGD transistors in a sub-block are connected and commonly driven. The SGS transistors in SB0, SB1, SB2 and SB3 may connected to one another and commonly driven. In another approach, the SGS transistors are driven by separate control lines.

FIG. 8A depicts control gate layers in the block BLK0, consistent with FIG. 7. The control gate layers are arranged in a stack 800 and include dummy word lines layers or control gate layers WLDS0, WLDS1, WLDD0 and WLDD1, and data word line layers or control gate layers WLL0-WLL10, which are shared among the different sub-blocks SB0-SB3. The control gate layers include a common SGS control gate layer for the block, and separate SGD control gate layers for each sub-block. For example, SB0 includes SGD0(0) and SGD1(0), SB1 includes SGD0(1) and SGD1(1), SB2 includes SGD0(2) and SGD1(2), and SB3 includes SGD0(3) and SGD1(3). Additionally, four example memory holes are depicted in each sub-block. SGD transistors 718, 718a, 718b and 718c are depicted in SGD0(0), SGD transistor 717 is depicted in SGD1(0) and dummy memory cell 716 is depicted in WLDD0.

FIG. 8B depicts additional detail of the block BLK0 of FIG. 7. Example memory cells are depicted which extend in the x direction along word lines in each sub-block. Each memory cell is depicted as a square for simplicity. SB0, SB1, SB2 and SB3 include NAND strings 700n-704n, 710n-714n, 720n-724n and 730n-734n, respectively. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, a bit line BL3 is connected to NAND strings 703n, 713n, 723n and 733n, and a bit line BL4 is connected to NAND strings 704n, 714n, 724n and 734n. Sense circuits may be connected to each bit line. For example, sense circuits 180-184 (similar to the sense circuits 60-63 of FIG. 2, for example) are connected to bit lines BL0-BL4, respectively.

Programming and reading can occur for selected cells in one word line and one sub-block at a time. This allows each selected cell to be controlled by a respective bit line and/or source line. For example, a set of memory cells, which includes an example memory cell 714, is connected to WLL10 in SB0. This is the drain-end data word line. WLL0 is the source-end data word line. A set of memory cells may be programmed or read concurrently. An additional set of memory cells is connected to WLL10 in each of the other sub-blocks SB1-SB3.

In this example, the source line SL or source region (well region 611a) is driven at a voltage Vsource.

Each NAND string includes one or more SGD transistors at the drain-end and one or more SGS transistors at the source end. In this case, there are two SGD transistors and one SGS transistor per string. Each SGD transistor may be connected to separate control line layer, as in FIG. 8A, so that it can be driven separately, or the two or more SGD transistors in a string may have their control gates connected and commonly driven.

The NAND string 700n includes SGD transistors 788 and 787 connected to select gate lines SGD0(0) and SGD1(0), respectively, dummy memory cells 786 and 785 connected to WLDD0 and WLDD1, respectively, and data memory cell 784 connected to WLL10. The NAND string 700n also includes an SGS transistor 780 connected to a select gate line SGS, dummy memory cells 781 and 782 connected to WLDS0 and WLDS1, respectively, and data memory cell 783 connected to WLL0. Data memory cells 784a, 784b, 784c and 784d in NAND strings 701n, 702n, 703n and 704n, respectively, are also connected to WLL10. For example, WLL10 may be a selected word line in a program operation, where the memory cells 784-784d are selected memory cells connected to the selected word line. BL0-BL5 are respective bit lines connected to the NAND strings 700n-704n, respectively.

FIG. 9A depicts a threshold voltage (Vth) distribution of a set of memory cells at the start of a two-pass program operation. The memory cells are initially in the erased (Er) state as represented by a Vth distribution 910. In an erase operation, the data memory cells transition from the Vth distributions of the programmed data states, e.g., states A-G, to the erased state. The erase operation can include multiple erase-verify loops. In each loop, the memory cells are biased for erasing after which an erase-verify test is performed. The erase-verify test can use an erase verify voltage, VvEr, which is applied to the word lines.

FIG. 9B depicts a Vth distribution of a set of memory cells after the first pass of a two-pass program operation. In this example, the memory cells assigned to the higher data states (such as the top half of the data states comprising states D-G in this example) are programmed while memory cells assigned to the lower data states (such as the bottom half of the data states comprising states Er-C in this example) are not programmed and remain in the erased state. In this example of the first program pass, multiple program loops are performed using a voltage signal such as in FIG. 10A, and verify tests are performed after each program pulse by applying the verify voltage VvINT to the selected word line. The Vth distribution 920, having a width W1, is obtained after the first program pass.

FIG. 9C depicts a Vth distribution of a set of memory cells after the second pass of a two-pass program operation. Multiple program loops are performed using a voltage signal such as in FIG. 10B, and verify tests are performed after each program pulse by applying one or more of the verify voltages VvA-VvG to the selected word line. The memory cells assigned to the bottom half of the data states transition from the Vth distribution 910 to a set 922 of different Vth distributions for the lower data states. The memory cells assigned to the Er state are not programmed and continue to be represented by the Vth distribution 910. The memory cells assigned to the A, B and C states are programmed to the Vth distributions 911, 912 and 913, respectively.

The memory cells assigned to the top half of the data states transition from the Vth distribution 920 to a set 923 of different Vth distributions for the higher data states. The memory cells assigned to the D, E, F and G states are programmed to the Vth distributions 914, 915, 916 and 917, respectively.

The programming parameters such as VvINT are selected so that the upper tail of the Vth distribution 920 will be close to, but below, the upper tail of the desired Vth distribution 914 (see dotted line 921). If the upper tail of the Vth distribution 920 is too high, the upper tail of the final Vth distribution 914 for the D state memory cells (the lowest data state of the higher data states) will be too high.

The memory cells which are programmed to the A, B, C, D, E, F and G states using the verify voltages of VvA, VvB, VvC, VvD, VvE, VvF and VvG, respectively, are represented by the Vth distributions 911, 912, 913, 914, 915, 916 and 917, respectively. The verify voltages are used in the verify operations or tests of the memory cells in the second program pass.

The data states include an erased state (Er) and programmed states (A-G). The programmed states can include lower data states A-C and higher data states D-G. When the techniques described herein are not used, the upper tail of the Vth distribution of the lower data states tends to increase due to NWI, as depicted by Vth distributions 911a, 912a and 913a for the A, B and C data states, respectively. The lower tail of the Vth distribution of the higher data states tends to decrease due to charge loss as depicted by Vth distributions 915a, 916a and 917a for the E, F and G data states, respectively. The Vth distribution 914a of the D state is shown with both the lower tail decreasing and the upper tail increasing. This is an example only.

Read voltages VrA, VrB, VrC, VrD, VrE, VrF and VrG can be used for reading the states of the memory cells in a read operation.

FIG. 10A depicts an example voltage signal used in the first pass of the two-pass program operation of FIG. 9A-9C. During a program operation, program loops are performed for a selected word line in a selected sub-block. A program loop comprises a program portion in which a program voltage or pulse is applied to the selected word line followed by a verify portion in which one or more verification signals are applied to the selected word line. During the application of the verification signal (see example verify voltage pulse 1002), verify operations, also referred to as verify tests, are performed for the associated memory cells.

Moreover, in this comparative example of multi-pass programming, several program loops are performed in both the first and second program passes. In the first program pass, a voltage signal 1000 includes a set of program voltages, including an initial program voltage 1001, which are applied to a word line selected for programming. In this example, the voltage signal includes program voltages which increase stepwise in amplitude in one or more program loops of a programming pass using a fixed or varying step size. This is referred to as incremental step pulse programming, where the program voltage starts at an initial level, Vpgm_int1, and increases in a step in each successive program loop, for instance, until the program operation is completed. The operation is successfully completed when the threshold voltages of the memory cells assigned to the higher data states reach the intermediate verify voltage VvINT as shown in FIG. 9B. An example verify voltage pulse 1002 is also depicted.

As mentioned, this comparative example of a first program pass can be time consuming and can result in NWI and charge loss.

FIG. 10B depicts an example voltage signal used in the second pass of the two-pass program operation of FIG. 9A-9C. A voltage signal 1010 includes a set of program voltages, including an initial program voltage 1011, which are applied to a word line selected for programming. The second program pass also uses incremental step pulse programming, but typically has more program loops than the first program pass (e.g., 22 versus 7). The initial program voltage, Vpgm_init2 can be different, e.g., lower, in the second pass than in the first program pass. Other program parameters such as program voltage step size can be different, e.g., smaller, than in the first program pass. The second program pass has a goal of programming the Vth of the memory cells to a narrow Vth distributions so that these memory cells and can be distinguished as representing the assigned data states in a subsequent read operation.

Figure 10C:
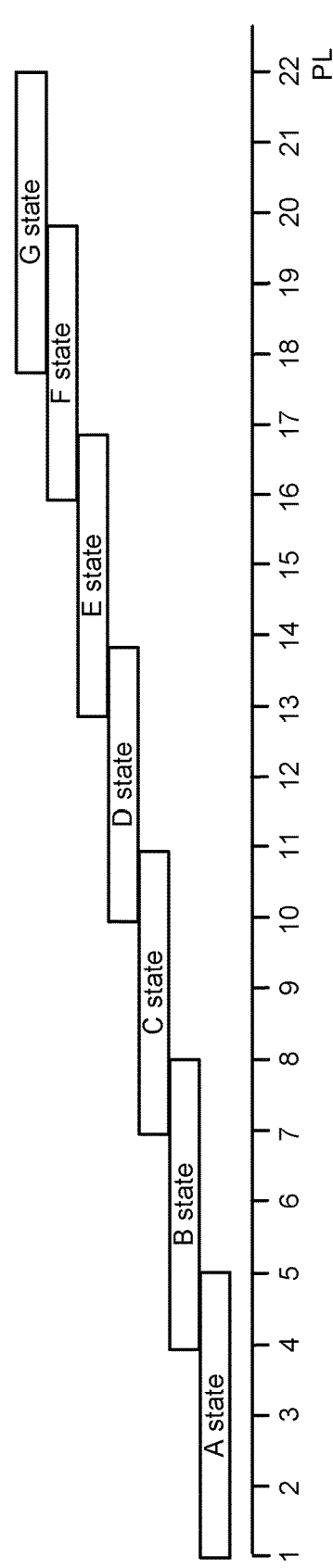
FIG. 10C depicts an example of the verification of different data states in the different program loops of FIG. 10B.

The verification signals in each program loop, including example verification signals 1012, can encompass lower assigned data states and then midrange assigned data states and then higher assigned data states as the program operations proceeds, as depicted in FIG. 10C. The example verification signals depict three verify voltages as a simplification. As used herein, a verification signal comprises a signal which is applied to a selected word line during a program loop after the application of a program voltage to the selected word line. The verification signal is part of a sensing operation. Memory cells are sensed during the application of the verification signal to judge their programming progress. A verification signal includes one or more voltages which are used to judge whether the memory cell has completed programming to an assigned data state. The result of sensing of the Vth relative to a verify voltage can be used to inhibit further programming of a memory cell.

The data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. An example encoding of bits for the A-G states is provided in FIG. 24. The data of the lower page can be determined by reading the memory cells using read voltages of VrA and VrE. The data of the middle page can be determined by reading the memory cells using read voltages of VrB, VrD and VrF. The data of the upper page can be determined by reading the memory cells using read voltages of VrC and VrG.

FIG. 10C depicts an example of the verification of different data states in the different program loops of FIG. 10B. The horizontal bars are time-aligned with the program loop axis of FIG. 10A. The bars overlap in some program loops, indicating that verify operations can be performed for multiple data states in the program loop. The bars indicate that verify voltages for the A, B, C, D, E, F and G states are applied in verification signals in program loops 1-5, 4-8, 7-11, 10-14, 13-17, 16-20 and 18-22, respectively. As mentioned, since at least some of the memory cells are programmed to intermediate Vth distributions in the first program pass, their Vth increase in the second program pass is reduced, so that NWI and charge loss is also reduced.

FIG. 11A depicts a flowchart of an example multi-pass program operation. At step 1100, a command is received to perform a program operation for a set of memory cells connected to a selected word line. For example, this could include the sets 2500 and 2600 of memory cells in FIGS. 25 and 26, respectively. The command may be issued by the host 140 and received by the controller 122, for example. Step 1101 includes performing a first program pass for the set of memory cells by applying one or more program pulses to the selected word line without performing verify tests.

Figure 22A:
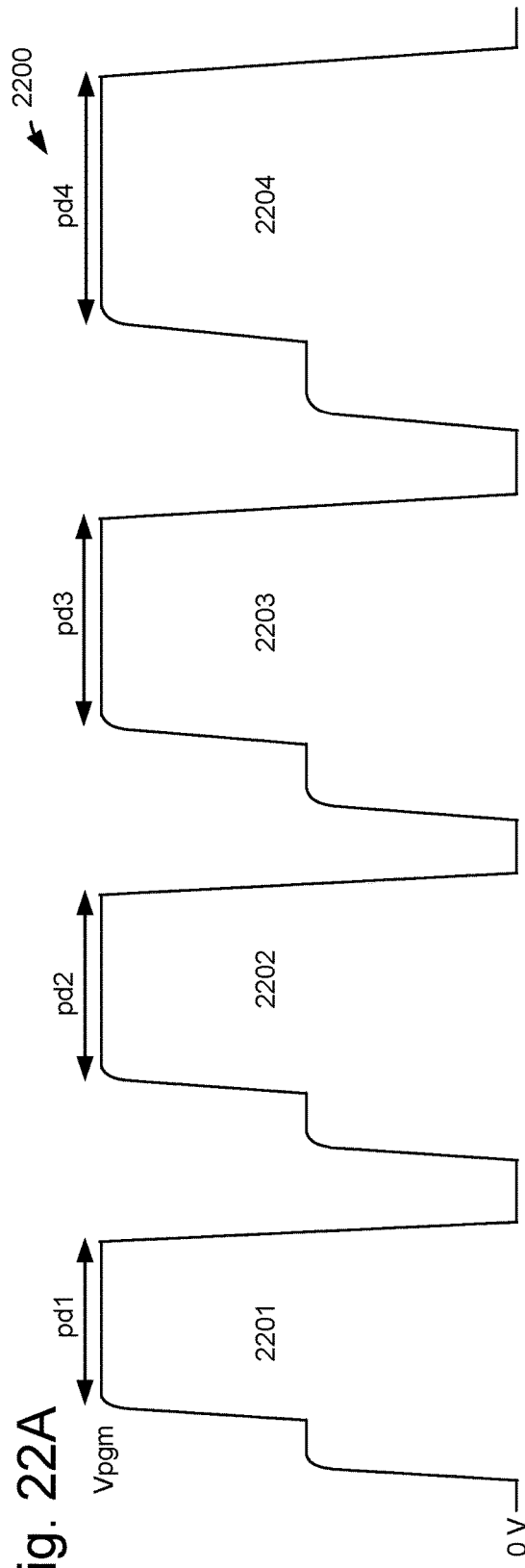
FIG. 22A depicts an example program voltage signal for use in the example of FIG. 12A.
Figure 22B:
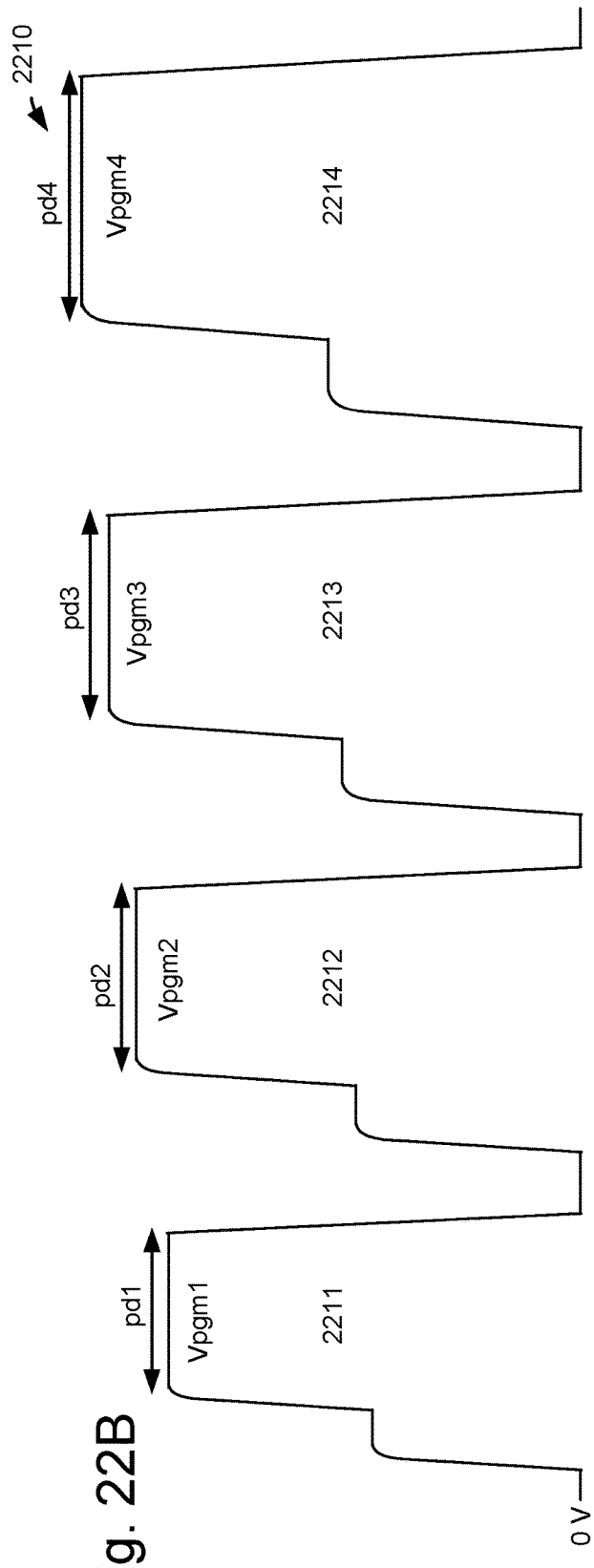
FIG. 22B depicts another example program voltage signal for use in the example of FIG. 12A.

See, e.g., FIGS. 22A and 22B. Step 1102 includes performing a second program pass for the set of memory cells by applying a set of program pulses to the selected word line and performing verify tests. See, e.g., FIG. 10B.

The first and second program passes can refer to any two program passes of a multi-pass program operation. The program operation could have three or more program passes, for example. The first program pass may refer to a program pass in which memory cells are programmed to intermediate Vth distributions, e.g., Vth distributions between those of the erased state and the final data state. For example, memory cells may be programmed from the erased state to the intermediate Vth distributions. The second program pass may refer to a program pass which is after the first program pass. For example, memory cells may be programmed from the intermediate Vth distributions to the final Vth distributions in the second program pass. Or, memory cells may be programmed from the intermediate Vth distributions to Vth distributions which are slightly below the final Vth distributions in the second program pass. A third program pass may then be performed in which the Vth distributions which are slightly below the final Vth distributions transition higher to the final Vth distributions.

Various example implementations of a first program pass are discussed in the flowcharts of FIG. 11B-11E. An example implementation of a second program pass is discussed in the flowchart of FIG. 11F.

FIG. 11B depicts a flowchart of a first example implementation of the first program pass of FIG. 11A. Step 1110 includes identifying a first subset of the set of memory cells which are configured to be programmed to lower data states (e.g., A-C or S1-S7) of a set of data states (e.g., A-G or S1-S15). For example, see the first subset 2501 or 2601 in FIG. 25 or FIG. 26, where eight or sixteen data states, respectively, are used. This includes memory cells 2504-2506 which are configured to be programmed to the A-C data states, respectively, in FIG. 25, or memory cells 2604-2610 which are configured to be programmed to the S1-S7 data states, respectively, in FIG. 26. The identifying of the first subset can involve reading the latches which are associated with each NAND string. The latches are loaded at a start of the program operation with bits which identify the assigned data state of each memory cell connected to the selected word line. See FIG. 24.

A memory cell may be configured to be programmed to a data state when associated latches store a bit sequence which represents the data state, for example.

Step 1111 includes identifying a second subset of the set of memory cells which are configured to be programmed to higher data states (e.g., D-G or S8-S15) of the set of data states. For example, see the second subset 2502 or 2602 in FIG. 25 or FIG. 26, respectively. This includes memory cells 2507-2510 which are configured to be programmed to the D-G data states, respectively, in FIG. 25, or memory cells 2611-2618 which are configured to be programmed to the S8-S15 data states, respectively, in FIG. 26. The identifying of the second subset can involve reading the latches which are associated with each NAND string.

The higher data states can be the top half of the set of data states, for instance. The lower data states can be the bottom half of the set of data states, for instance. Or, the lower data states can be the programmed data states in the bottom half of the set of data states. The lower data states are below the higher data states. That is, the Vth distributions or the verify voltages of the lower data states are below the Vth distributions or verify voltages, respectively, of the higher data states.

Step 1112 includes setting a program-inhibit voltage, e.g., 2-3 V, for bit lines connected to the first subset of the set of memory cells. A program-inhibit bit line voltage is a voltage which is sufficiently high in relation to the control gate voltage of an SGD transistor to place the SGD transistor in a non-conductive state so that programming of the associated NAND string is prevented, as the programming relies on a flow of electrons between the bit line and the NAND string channel. A program-inhibit bit line voltage is greater than the control gate voltage minus the Vth of the SGD transistor. For example, with Vcg=2.5 V and Vth=1 V, the program-inhibit bit line voltage is greater than 1.5 V. This step ensures that the first subset of the set of memory cells is not programmed when a program pulse is applied.

Step 1113 includes setting different program-enable voltages, e.g., 0-1 V, for bit lines connected to the second subset of the set of memory cells according to their different assigned data states. A program-enable bit line voltage is a voltage which is sufficiently low in relation to the control gate voltage of an SGD transistor to place the SGD transistor in a conductive state so that programming of the associated NAND string is enabled. A program-enable bit line voltage is less than the control gate voltage (Vcg) minus the Vth of the SGD transistor minus a margin such as 0.5-1 V. For example, with Vcg=2.5 V, Vth=1 V and a margin of 0.5 V, the program-inhibit bit line voltage is less than 1 V. This step ensures that the second subset of the set of memory cells is programmed when a program pulse is applied.

The program-enable bit line voltage is lower when the assigned data state is greater. That is, the program-enable bit line voltage is a decreasing function of the assigned data state. For example, with four data states D-G in the second subset, the program-enable bit line voltage can be 0.75 V, 0.5 V, 0.25 V or 0 V for the D, E, F or G states, respectively as depicted in FIG. 23A and the plots 2334, 2333, 2332 and 2331, respectively. With eight states S8-S15 in the second subset, the program-enable bit line voltage can be 1.2 V, 1 V, 0.8 V, 0.6 V, 0.4 V, 0.2 V or 0 V for the S8, S9, S10, S11, S12, S13, S14 or S15 states, respectively, as depicted in FIG. 23A and the plots 2347, 2346, 2345, 2344, 2343, 2342 and 2341, respectively.

Step 1114 includes applying a single program pulse to the selected word line, without performing verify tests. This occurs while the bit line voltages are applied as described in steps 1112 and 1113. Each memory cell in the second subset is programmed, e.g., has an increase in Vth, when the program pulse is applied. Additionally, the amount of programming is a function of the program-enable bit line voltage. When the program-enable bit line voltage is relatively low, the SGD transistor is in a relatively highly conductive state, so that a relatively large amount of electrons can flow between the bit line and the NAND string channel, and there is a relatively large Vth increase for the selected memory cell in the NAND string.

See Examples 1A, 1B, 2A, 2B at FIG. 12A-15B for further details.

In one embodiment, FIG. 11B provides a method comprises: performing a first program pass of a program operation for a set of memory cells connected to a word line, wherein each memory cell is in a respective NAND string, the respective NAND strings are connected to respective bit lines, and the programming in the first program pass comprises applying a program pulse to the word line while setting different program-enable voltages on some of the respective bit lines (e.g., the bit lines connected to the memory cells being programmed and not to the memory cells assigned to the erased state) and not applying a verify voltage to the word line. After the first program pass of FIG. 11B, FIG. 11F provides a method comprising: performing a second program pass of the program operation by performing a plurality of program loops, wherein each program loop is performed by applying a program pulse followed by a verify voltage to the word line.

In one approach, a first subset of the set of memory cells (e.g., subset 2501 or 2601) is configured to be programmed to lower data states (e.g., states A-C or S1-S7) of a set of data states (e.g., states A-G or S1-S15), a second subset (e.g., subset 2502 or 2602) of the set of memory cells is configured to be programmed to higher data states (e.g., states D-G or S8-S15) of the set of data states, and the different program-enable voltages are set on respective bit lines of the second subset of the set of memory cells while a program-inhibit voltage is set on respective bit lines of the first subset of the set of memory cells.

Figure 11C:
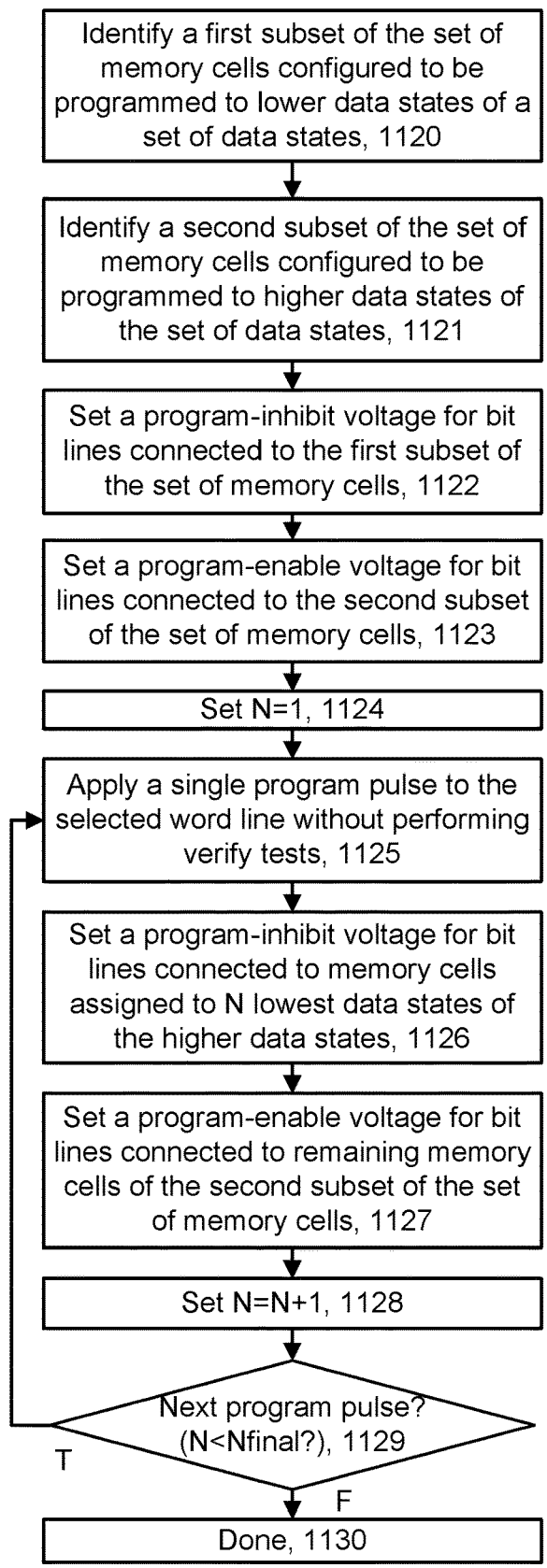
FIG. 11C depicts a flowchart of a second example implementation of the first program pass of FIG. 11A.

FIG. 11C depicts a flowchart of a second example implementation of the first program pass of FIG. 11A. Step 1120 includes identifying a first subset of the set of memory cells which are configured to be programmed to lower data states of a set of data states, similar to step 1110. Step 1121 includes identifying a second subset of the set of memory cells which are configured to be programmed to higher data states of the set of data states, similar to step 1111. Step 1122 includes setting a program-inhibit voltage for bit lines connected to the first subset of the set of memory cells. Step 1123 includes setting a program-enable voltage for bit lines connected to the second subset of the set of memory cells. A single program-enable voltage such as 0 V may be set.

Step 1124 sets a counter N=1. N is a positive integer. Step 1125 includes applying a single program pulse to the selected word line, without performing verify tests. This occurs while the bit line voltages are applied as described in steps 1122 and 1123. Each memory cell in the second subset is programmed, e.g., has an increase in Vth, by a same amount when the program pulse is applied. For example, in FIG. 16A, the Vth distribution 1200 is obtained. Step 1126 includes setting a program-inhibit voltage for bit lines connected to memory cells assigned to N lowest data states of the higher data states. For example, when the higher data states are D-G, the N lowest data state is D when N=1, D and E when N=2, and D, E and F when N=3. Step 1127 includes setting a program-enable voltage for bit lines connected to remaining memory cells of the second subset of the set of memory cells. For example, the program-enable voltage is provided for the memory cells assigned to the E, F and G states when N=1, F and G when N=2 and G when N=2.

Step 1128 increments N by one. A decision step 1129 determines if a next program pulse should be applied, e.g., whether N<Nfinal, where Nfinal=4 for the case of a set of eight data states. Nfinal is a positive integer. If decision step 1129 is true, the flowchart is followed at step 1125 with the application of another program pulse without performing a verify test. For example, in FIG. 16A-16D, the Vth distribution 1201, 1202 and 1203 are obtained when N=2, 3 and 4, respectively. If the decision step 1129 is false, the program pass is done at step 1130.

See Examples 3A and 3B at FIG. 16A-16F for further details.

Figure 11D:
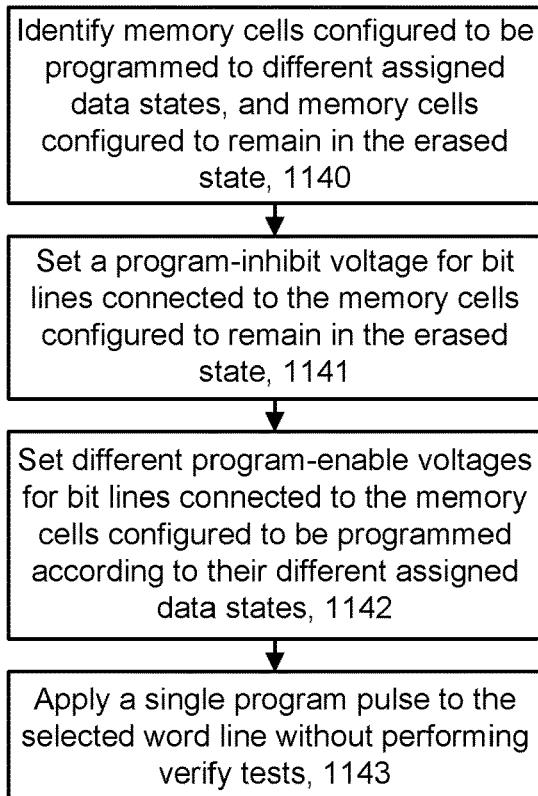
FIG. 11D depicts a flowchart of a third example implementation of the first program pass of FIG. 11A.

FIG. 11D depicts a flowchart of a third example implementation of the first program pass of FIG. 11A. Step 1140 includes identifying memory cells configured to be programmed to different assigned data states (e.g., A-G or S1-S15), and memory cells configured to remain in the erased state. For example, in FIGS. 25 and 26, the memory cells configured to be programmed to different assigned data states include the memory cells 2504-2510 and 2604-2618, respectively, and the memory cells configured to remain in the erased state include the memory cells 2503 and 2603, respectively.

Step 1141 includes setting a program-inhibit voltage for bit lines connected to the memory cells configured to remain in the erased state. Step 1142 includes setting different program-enable voltages for bit lines connected to the memory cells configured to be programmed according to their different assigned data states. For example, see FIG. 23A and the plots 2331-2334 and 2341-2347.

Step 1143 includes applying a single program pulse to the selected word line without performing verify tests.

See Examples 4A and 4B at FIG. 17A-18B for further details. For instance, in FIG. 17A, the single program pulses results in the Vth distributions 1700-1706.

In one approach, FIG. 11D provides a method in which a first subset (e.g., subset 2501 or 2601) of a set of memory cells (2500 or 2600) is configured to be programmed to lower data states (e.g., states A-C or S1-S7) of a set of data states (e.g., states Er-G or S0-S15), a second subset (e.g., subset 2502 or 2602) of the set of memory cells is configured to be programmed to higher data states (e.g., states D-G or S8-S15) of the set of data states, and the different program-enable voltages are set on respective bit lines of the first subset of the set of memory cells and on respective bit lines of the second subset of the set of memory cells.

Figure 11E:
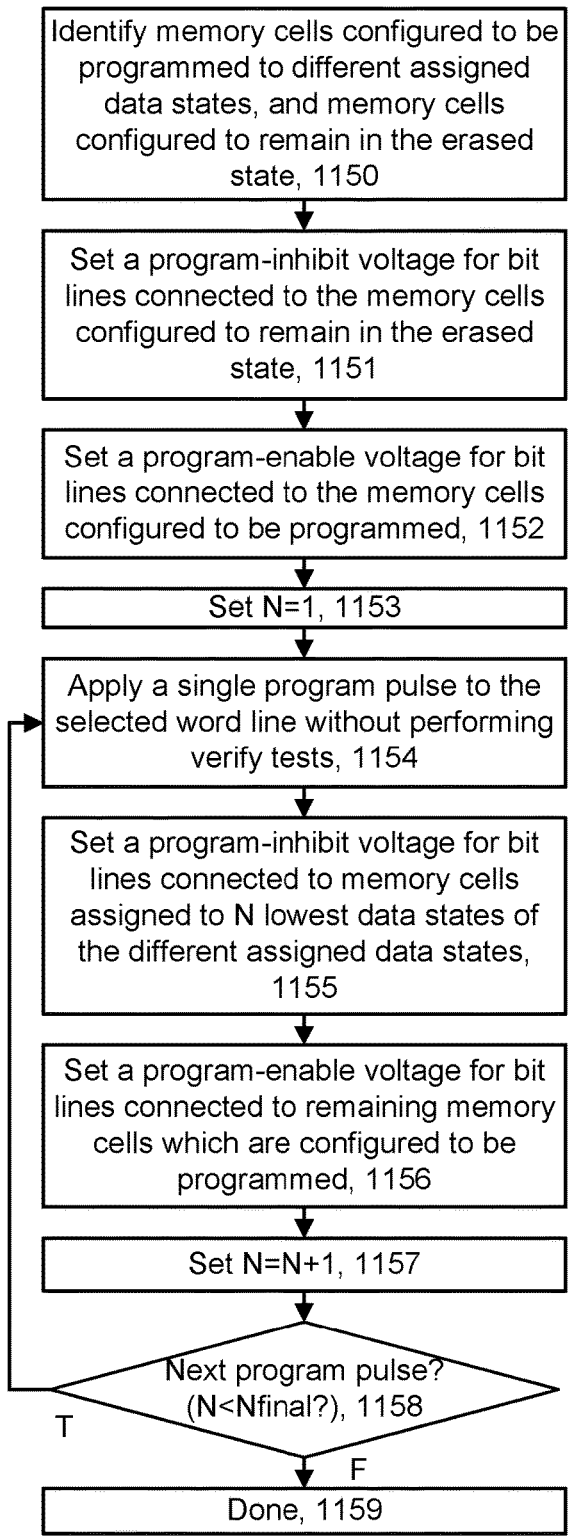
FIG. 11E depicts a flowchart of a fourth example implementation of the first program pass of FIG. 11A.
Figure 11F:
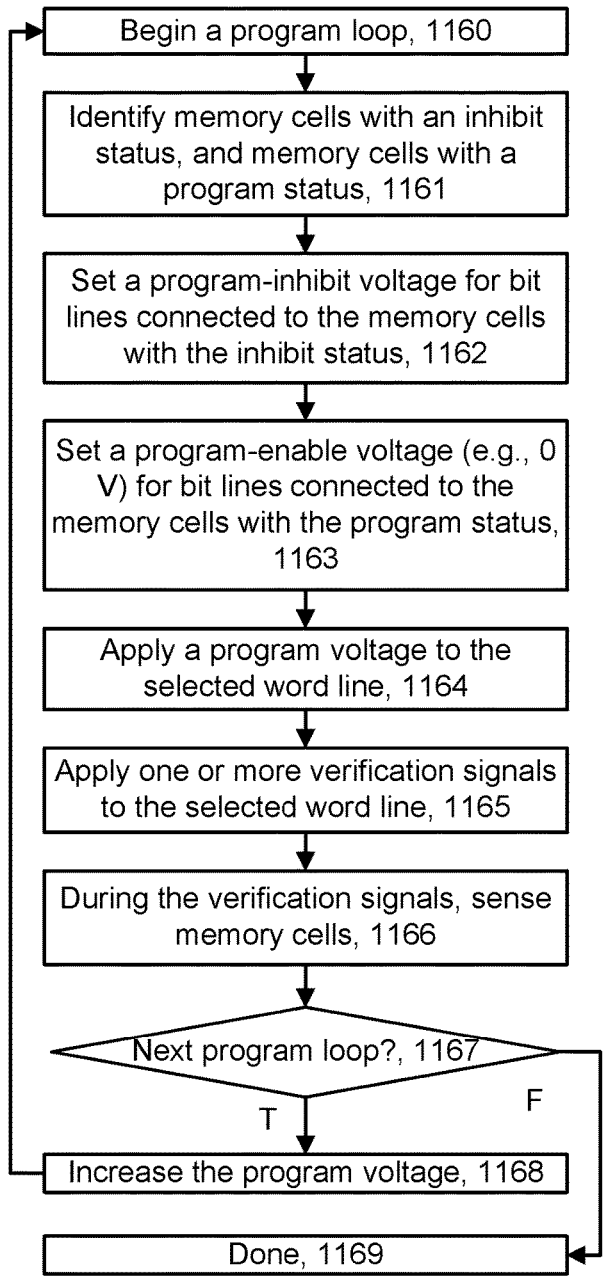
FIG. 11F depicts a flowchart of an example implementation of the second program pass of FIG. 11A.

FIG. 11E depicts a flowchart of a fourth example implementation of the first program pass of FIG. 11A. Step 1150 includes identifying memory cells which are configured to be programmed to different assigned data states (e.g., A-G or S1-S15), and memory cells configured to remain in the erased state. Step 1151 includes setting a program-inhibit voltage for bit lines connected to the memory cells configured to remain in the erased state. Step 1152 includes setting a program-enable voltage for bit lines connected to the memory cells configured to be programmed. A single program-enable voltage such as 0 V may be set.

Step 1153 sets a counter N=1. Step 1154 includes applying a single program pulse to the selected word line, without performing verify tests. This occurs while the bit line voltages are applied as described in steps 1151 and 1152. Each memory cell is programmed by a same amount when the program pulse is applied. For example, in FIG. 19A, the Vth distribution 1700 is obtained. Step 1155 includes setting a program-inhibit voltage for bit lines connected to memory cells assigned to N lowest data states of the different assigned data states. For example, when the assigned data states are A-G, the N lowest data state is A when N=1, A and B when N=2, A-C when N=3, A-D when N=4, A-E when N=5 and A-F when N=6. Step 1156 includes setting a program-enable voltage for bit lines connected to remaining memory cells which are configured to be programmed. For example, the program-enable voltage is provided for the memory cells assigned to the B-G states when N=1, C-G when N=2, D-G when N=3, E-G when N=4, F and G when N=5 and G when N=6. Step 1157 increments N by one. A decision step 1158 determines if a next program pulse should be applied, e.g., whether N<Nfinal, where Nfinal=8 for the case of a set of eight data states. If decision step 1158 is true, the flowchart is followed at step 1154 with the application of another program pulse without performing a verify test. For example, in FIG. 19A-19G, the Vth distribution 1701-1706 are obtained when N=2-7, respectively. If the decision step 1158 is false, the program pass is done at step 1159.

See Examples 5A at FIG. 19A-20C for further details.

FIGS. 11C and 11E provide an incremental, multi-program pulse approach to programming in the first program pass, where the bit line voltage can be fixed at Vbl=0 V or otherwise be independent of the assigned data states during the program pulses. FIGS. 11B and 11D can involve a single program pulse in the first program pass, where the bit line voltage depends on the assigned data states.

In the approach of FIGS. 11B and 11D, the magnitude of bit line voltages may be limited in some cases by the window of the SGD transistors. That is, Vbl=0 V may be set for the memory cells with the highest assigned data state, while a peak Vbl may be set for the memory cells with the lowest assigned data state. If the peak Vbl is too great, the SGD transistor can transition to a non-conductive state which does not allow programming. Accordingly, one approach or the other may be more suitable for a given memory device.

FIG. 11F depicts a flowchart of an example implementation of the second program pass of FIG. 11A. Step 1160 begins a program loop. Step 1161 includes identifying memory cells with an inhibit status, and memory cells with a program status. For example, the bit sequences in the latches may be read as depicted in FIG. 24 to identify the memory cells assigned to the Er state and the memory cells assigned to the A-G states. Step 1162 includes setting a program-inhibit voltage for bit lines connected to the memory cells with the inhibit status. Step 1163 includes setting a program-enable voltage (e.g., 0 V) for bit lines connected to the memory cells with the program status. Step 1164 includes applying a program voltage or pulse to the selected word line while the bit line voltages are set as in steps 1162 and 1163. See Vwl_sel in the program phase 2352 in FIG. 23B. Step 1165 includes applying one or more verification signals to the selected word line. See Vwl_sel and the verification signal 2354 in the verify phase 2353 in FIG. 23B. The verification signal comprises verification voltages such as VvA and VvB in FIG. 23B. Step 1166 includes, during the verification signals, sensing the memory cells. The sensing of a memory cell during a verification signal is a verify test since it tests the Vth of the memory cell relative to the voltage of the verification signal. In a given program loop, verify tests may be performed on a subset of the memory cells with the program status as discussed, e.g., in connection with FIG. 10C.

A decision step 1167 determines whether a next program loop should be performed. If the decision step is true, the program voltage is increased at step 1168 and a next program loop begins at step 1160, if programming has not been completed for all data states. Programming is completed for a data state when all or nearly all of the memory cells assigned to the data state are inhibited from programming. If the decision step is false, the program pass, and the program operation, are done at step 1169.

Figure 11G:
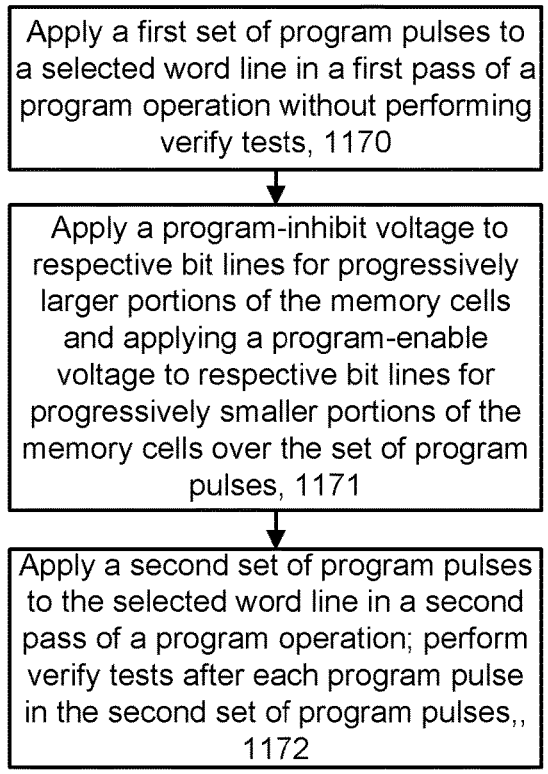
FIG. 11G depicts a flowchart of another example implementation of the program operation of FIG. 11A.

FIG. 11G depicts a flowchart of another example implementation of the program operation of FIG. 11A. The flowchart is also consistent with FIGS. 11C and 11E. Step 1170 includes applying a first set of program pulses to a selected word line in a first pass of a program operation without performing verify tests. For example, this could be the set of program pulses in FIG. 22A or 22B. In Example 3A, FIG. 16A-16D, a set of four program pulses is used. In Example 3B, FIGS. 16E and 16F, a set of two program pulses is used. In Example 5A, FIG. 19A-19G, a set of seven program pulses is used. In Example 5B, FIG. 20A-20C, a set of three program pulses is used. The number of program pulses in the first pass can be equal to the number of intermediate Vth distributions.

Step 1171 includes applying a program-inhibit voltage to respective bit lines for progressively larger portions of the memory cells and applying a program-enable voltage to respective bit lines for progressively smaller portions of the memory cells over the set of program pulses. For example, in Example 3A, FIG. 16A-16D, during the first, second, third and fourth program pulses, a program-inhibit voltage is applied to respective bit lines for memory cells assigned to the Er-C states (memory cells 2503-2506 in FIG. 25), Er-D states (memory cells 2503-2507 in FIG. 25), Er-E states (memory cells 2503-2508 in FIG. 25) and Er-F states (memory cells 2503-2509 in FIG. 25), respectively, and a program-enable voltage is applied to respective bit lines for memory cells assigned to the D-G states (memory cells 2507-2510 in FIG. 25), E-G states (memory cells 2508-2510 in FIG. 25), F and G states (memory cells 2509 and 2510 in FIG. 25), and the G state (memory cells 2510 in FIG. 25), respectively.

In Example 3B, FIGS. 16E and 16F, during the first and second program pulses, a program-inhibit voltage is applied to respective bit lines for memory cells assigned to the Er-C states, and Er-E states, respectively, and a program-enable voltage is applied to respective bit lines for memory cells assigned to the D-G states, and the F and G states, respectively.

In Example 5A, FIG. 19A-19G, during the first, second, third, fourth, fifth, sixth and seventh program pulses, a program-inhibit voltage is applied to respective bit lines for memory cells assigned to the Er state (memory cells 2503 in FIG. 25), Er and A states (memory cells 2503-2504 in FIG. 25), Er-B states (memory cells 2503-2505 in FIG. 25), Er-C states (memory cells 2503-2506 in FIG. 25), Er-D states (memory cells 2503-2507 in FIG. 25), Er-E states (memory cells 2503-2508 in FIG. 25) and Er-F states (memory cells 2503-2509 in FIG. 25), respectively, and a program-enable voltage is applied to respective bit lines for memory cells assigned to the A-G states (memory cells 2504-2510 in FIG. 25), B-G states (memory cells 2505-2510 in FIG. 25), C-G states (memory cells 2506-2510 in FIG. 25), D-G states (memory cells 2507-2510 in FIG. 25), E-G states (memory cells 2508-2510 in FIG. 25), F and G states (memory cells 2509 and 2510 in FIG. 25), and G state (memory cells 2510 in FIG. 25), respectively.

In Example 5B, FIG. 20A-20C, during the first, second and third program pulses, a program-inhibit voltage is applied to respective bit lines for memory cells assigned to the Er and A states (memory cells 2503 and 2504 in FIG. 25), Er-C states (memory cells 2503-2506 in FIG. 25), and Er-E states (memory cells 2503-2508 in FIG. 25), respectively, and a program-enable voltage is applied to respective bit lines for memory cells assigned to the B-G states (memory cells 2504-2510 in FIG. 25), D-G states (memory cells 2507-2510 in FIG. 25), and F and G states (memory cells 2509 and 2510 in FIG. 25), respectively.

Step 1172 includes applying a second set of program pulses to the selected word line in a second pass of a program operation, and performing verify tests after each program pulse in the second set of program pulses. For example, see the second set of program pulses of FIG. 10B.

An apparatus for implementing the process of FIG. 11G can comprise a set of memory cells connected to a word line, where each memory cell is in a respective NAND string, and the respective NAND strings are connected to a set of bit lines, and a control circuit. The control circuit, to perform a first program pass of a program operation is configured to: apply a first set of program pulses to the word line without performing verify tests for the memory cells, while applying a program-inhibit voltage to respective bit lines for progressively larger portions of the memory cells and applying a program-enable voltage to respective bit lines for progressively smaller portions of the memory cells over the first set of program pulses; and to perform a second program pass of the program operation, the control circuit is configured to apply a second set of program pulses to the word line and to perform verify tests after each program pulse of the second set of program pulses.

The number of program pulses in the first set of program pulses may be equal to a number of intermediate threshold voltage distributions to which the set of memory cells are programmed in the first program pass. In Example 3A, FIG. 16A-16D, a set of four program pulses is used and there are four corresponding intermediate Vth distributions. In Example 3B, FIGS. 16E and 16F, a set of two program pulses is used and there are two corresponding intermediate Vth distributions. In Example 5A, FIG. 19A-19G, a set of seven program pulses is used and there are seven corresponding intermediate Vth distributions. In Example 5B, FIG. 20A-20C, a set of three program pulses is used and there are three corresponding intermediate Vth distributions.

In one possible implementation, the intermediate threshold voltage distributions are mapped to final Vth distributions in the second program pass on a one-to-one basis. For example, see Example 3A and 5A.

In another possible implementation, the intermediate threshold voltage distributions are mapped to final Vth distributions in the second program pass on a one-to-many basis. For example, see Example 3B and 5B, which both use a one-to-two basis (one intermediate threshold voltage distributions mapped to two final Vth distributions).

In one approach, during a first program pulse of the first set of program pulses, the program-inhibit voltage is applied to respective bit lines for memory cells assigned to a lower half of a set of data states (e.g., states Er-C in Example 3A) and the program-enable voltage is applied to respective bit lines for memory cells assigned to an upper half of the set of data states (e.g., states D-G in Example 3A).

Figure 11H:
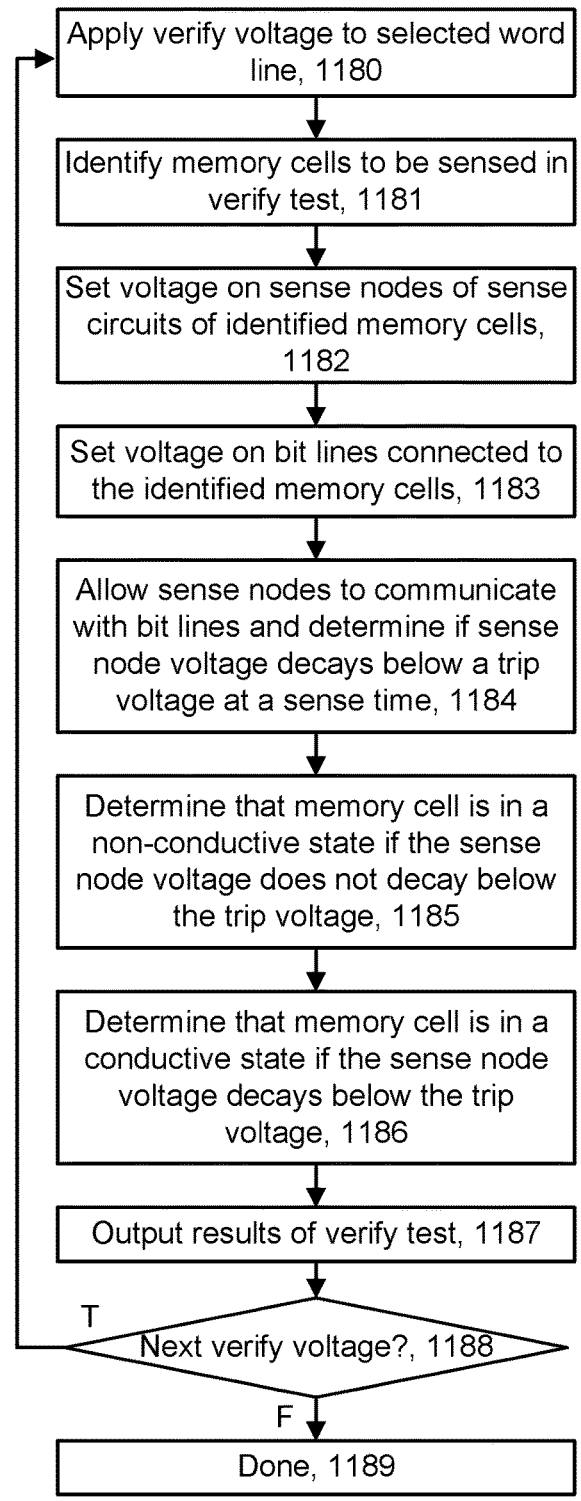
FIG. 11H depicts a flowchart of an example verify process for use in the second program pass of FIG. 11A, and provides further details of FIG. 11F, steps 1165 and 1166.

FIG. 11H depicts a flowchart of an example verify process for use in the second program pass of FIG. 11A, and provides further details of FIG. 11F, steps 1165 and 1166. Step 1180 includes applying a verify voltage to a selected word line. Step 1181 includes identifying memory cells to be sensed in a verify test. For example, the memory cells to be sensed can be those which have a program status and are assigned to a data state which matches the current verify voltage applied to the selected word line. Step 1182 includes setting the voltage on the sense nodes of sense circuits of the identified memory cells. These are sense nodes connected to the identified memory cells via respective bit lines. For example, the voltage Vsense can be provided to the sense node 171 in FIG. 2.

Step 1183 includes setting a voltage on bit lines connected to the identified memory cells. For example, the selector 56 in FIG. 2 can provide the voltage Vbl on the bit line BL. Step 1184 includes allowing the sense nodes to communicate with the respective bit lines and determining, for each of the sense nodes involved in the sensing, if the sense node voltage decays below a trip voltage at a sense time. Step 1185 includes determining that a memory cell is in a non-conductive state if the sense node voltage does not decay below the trip voltage. A memory cell is in a non-conductive state when its Vth exceeds the voltage of the verification signal. This indicates that the memory cell should be inhibited from further programming. Step 1186 includes determining that a memory cell is in a conductive state if the sense node voltage decays below the trip voltage. A memory cell is in a conductive state when its Vth is below the voltage of the verification signal. This indicates that the memory cell should be programmed further. Step 1187 includes outputting results of the verify test, e.g., to a controller.

A decision step 1188 determines if there is a next verify voltage to apply in the current program loop. If the decision step is true, the process is repeated at step 1180. If the decision step is false, the process is done at step 1189.

In FIG. 12A-20C, the vertical axis denotes a number of memory cells on a logarithmic scale and the horizontal axis denotes Vth on a linear scale.

FIG. 12A depicts a Vth distribution of a set of memory cells after a single program pulse in the first pass of a two-pass program operation, in an Example 1A, where eight data states are used. The erased state Vth distribution 910 of FIG. 9A is shown, along with first through fourth intermediate Vth distributions 1200-1203, respectively, for the memory cells assigned to the D-G states, respectively. An example Vth distribution width W2 is also depicted. Since a single program pulse is applied with no verify test, the width W2 will be wider than the width W1 in FIG. 9B. The width W2 is the natural Vth distribution width of the memory cells. The memory cells assigned to a data state can have physical differences which result in faster and slower programming cells, so that their Vth levels vary after a program pulse is applied.

Consistent with the process of FIG. 11B, the memory cells assigned to higher data states (e.g., D-G) are programmed to different intermediate Vth distributions 1200-1203 in a first program pass using a single program pulse. The intermediate Vth distributions 1200-1203 are then programmed to the final Vth distributions 914-917, respectively, for memory cells assigned to the D-G states, respectively, in a second program pass, as depicted in FIG. 12B. Moreover, there is a one-to-one mapping of the intermediate Vth distributions to the final Vth distributions. This means each intermediate Vth distribution is programmed higher to one respective final Vth distribution.

In one embodiment, during a single program pulse, a control circuit is configured to apply different program-enable voltages to respective bit lines of a second subset of the set of memory cells (memory assigned to states D-G) according to different assigned data states of the higher data states and to apply a program-inhibit voltage to respective bit lines of a first subset of the set of memory cells (memory assigned to states Er-C. The different program-enable voltages are highest for a lowest data state (e.g., Vbl=0.75 V for the D state) among the higher data states and lowest for a highest data state (G) among the higher data states (e.g., Vbl=0 V for the G state).

The control circuit, in the first program pass, is configured to inhibit programming of a first subset of the set of memory cells (memory cells assigned to states Er-C).

The first subset of the set of memory cells remain in an erase data state during the first program pass.

The higher data states may comprise no more than half of the set of data states.

FIG. 12B depicts a Vth distribution of a set of memory cells after the second pass of a two-pass program operation, in the Example 1A. The Vth distributions 910-917 of FIG. 9C are shown. Some of the memory cells of the erased state distribution 910 remain in the erased state while others are programmed to the A-C states. There is a one-to-four mapping of the erased state Vth distribution 910 to a set of Vth distributions 1204 of the Er-C states. The first program pass can be considered to provide a rough programming of the higher state memory cells while the second program pass provides a fine programming of the memory cells.

The program pulse can be optimized in its duration and magnitude to position the intermediate Vth distributions. For example, the upper tail of the Vth distributions 1200-1203 should be close to, but below, the upper tails of corresponding the final Vth distribution 914-917, respectively (see dotted lines 1205-1208 for the D-G states, respectively). This allows for some programming of the associated memory cells in the second program pass to narrow the Vth distributions while avoiding over programming. In particular, the memory cells at the lower tail of the Vth distributions 1200-1203 are programmed.

An advantage is that the Vth increase between the first and second program passes is reduced for the higher data states, thus reducing NWI and charge loss. Another advantage is that the number of program loops may be reduced in the second program pass compared to the comparative example of FIG. 9A-9C since the Vth of the memory cells assigned to the higher data states is closer to the final Vth distributions at the start of the second program pass.

FIG. 13A depicts a Vth distribution of a set of memory cells after a single program pulse in the first pass of a two-pass program operation, in an Example 1B which is an alternative to Example 1A. In contrast to FIG. 12A, there is a one-to-two mapping of the intermediate Vth distributions 1200 and 1202 to the final Vth distributions 914-917. In particular, there is a mapping of the intermediate Vth distribution 1200 to the Vth distributions 914 and 915 of a set of Vth distributions 1210, and a mapping of the intermediate Vth distribution 1202 to the Vth distributions 916 and 917 of a set of Vth distributions 1211.

Each intermediate Vth distribution which is obtained in the first program pass is programmed higher to multiple final Vth distributions in a second program pass. The Vth distributions 1201 and 1203 are not used. This provides a simpler implementation since two different bit lines voltages rather than four are used to obtain the intermediate Vth distributions.

FIG. 13B depicts a Vth distribution of a set of memory cells after the second pass of a two-pass program operation, in the Example 1B. There is a one-to-four mapping of the erased state Vth distribution 910 to the set of Vth distributions 1204.

FIG. 14A depicts a Vth distribution of a set of memory cells before the first pass of a two-pass program operation, in an Example 2A, where sixteen data states are used. The memory cells are all initially in the erased state as represented by the Vth distribution 1400.

FIG. 14B depicts a Vth distribution of a set of memory cells after a single program pulse in the first pass of a two-pass program operation, in the Example 2A. Consistent with the process of FIG. 11B, the memory cells assigned to higher data states (e.g., S8-S15) are programmed to different intermediate Vth distributions 1401-1408 in a first program pass using a single program pulse. The intermediate Vth distributions 1401-1408 are then programmed to the final Vth distributions of states S8-S15, respectively, in a second program pass as depicted in FIG. 14C. There is a one-to-one mapping of the intermediate Vth distributions to the final Vth distributions. The width W3 of each intermediate Vth distributions will be less than W2 due to the narrower spacing of the final Vth distributions compared to the eight-state example.

FIG. 14C depicts a Vth distribution of a set of memory cells after the second pass of a two-pass program operation, in the Example 2A. There is a one-to-eight mapping of the erased state Vth distribution 1400 to a set of Vth distributions 1409 for the S0-S7 states. There are fifteen programmed data states S1-S15 with corresponding verify voltages VvS1-VvS15. The erased state has an erase-verify voltage VvS0.

FIG. 15A depicts a Vth distribution of a set of memory cells after a single program pulse in the first pass of a two-pass program operation, in an Example 2B which is an alternative to Example 2A. There are four intermediate Vth distributions 1401, 1403, 1405 and 1407 instead of the eight in FIG. 14B. This can provide a simpler implementation. In another option, there can be two intermediate Vth distributions 1401 and 1405.

In contrast to FIG. 14B, there is a one-to-two mapping of the intermediate Vth distributions 1401, 1403, 1405 and 1407 to the final Vth distributions. In particular, there is a one-to-two mapping of the intermediate Vth distribution 1401 to a set of Vth distributions 1410 of the S8 and S9 states, a one-to-two mapping of the intermediate Vth distribution 1403 to a set of Vth distributions 1411 of the S10 and S11 states, a one-to-two mapping of the intermediate Vth distribution 1405 to a set of Vth distributions 1412 of the S12 and S13 states, and a one-to-two mapping of the intermediate Vth distribution 1407 to a set of Vth distributions 1413 of the S14 and S15 states.

FIG. 15B depicts a Vth distribution of a set of memory cells after the second pass of a two-pass program operation, in the Example 2B. As before, there is a one-to-eight mapping of the erased state Vth distribution 1400 to a set of Vth distributions 1409 for the S)-S7 states.

FIG. 16A depicts a Vth distribution of a set of memory cells after a first program pulse in the first pass of a two-pass program operation, in an Example 3A, where eight data states are used. The erased state Vth distribution 910 of FIG. 9A is shown, along with the first intermediate Vth distribution 1200 of FIG. 12A for the memory cells assigned to the D-G states, respectively.

Consistent with the process of FIG. 11C, the memory cells assigned to higher data states (e.g., D-G) are programmed to the first intermediate Vth distribution 1200 using a first program pulse without a verify test.

FIG. 16B depicts a Vth distribution of a set of memory cells after a second program pulse in the first pass of a two-pass program operation, in the Example 3A. The memory cells assigned to the E-G states are programmed to the second intermediate Vth distribution 1201 using a second program pulse without a verify test, while the memory cells assigned to the D state continue to be represented by the first intermediate Vth distribution 1200.

FIG. 16C depicts a Vth distribution of a set of memory cells after a third program pulse in the first pass of a two-pass program operation, in the Example 3A. The memory cells assigned to the F and G states are programmed to the third intermediate Vth distribution 1202 using a third program pulse without a verify test, while the memory cells assigned to the D and E states continue to be represented by the first and second intermediate Vth distributions 1200 and 1201, respectively.

FIG. 16D depicts a Vth distribution of a set of memory cells after a fourth program pulse in the first pass of a two-pass program operation, in the Example 3A. The memory cells assigned to the G state are programmed to the fourth intermediate Vth distribution 1203 using a fourth program pulse without a verify test, while the memory cells assigned to the D-F states continue to be represented by the intermediate Vth distributions 1200-1202, respectively.

The second program pass then proceeds as represented by FIGS. 12A and 12B.

This example requires more time than the example of FIGS. 12A and 12B since there are four program pulses instead of one in the first program pass. One advantage of this example is that it provides a solution when there is an insufficient range of adjustment for the program-enable bit line voltages to obtain the different intermediate Vth distributions of FIG. 16D with a single program pulse. A time savings is still achieved since verify tests are not performed, and the number of program pulses is less than the example of FIG. 10A.

In one implementation of FIG. 16B-16D, the program-enable bit line voltage is the same, e.g., 0 V, during each program pulse, and the program pulse magnitude and/or duration is adjusted to program the memory cells to each higher intermediate Vth distribution. Optionally, the program-enable bit line voltage could also differ during each program pulse.

In one embodiment, the first program pass uses an initial program pulse (e.g., pulses 2201 or 2211 in FIG. 22A or 22B, respectively) and one or more successive program pulses after the initial program pulse (e.g., pulses 2202-2204 or 2212-2214 in FIG. 22A or 22B, respectively). In the first program pass, a control circuit is configured to use the initial program pulse to program a second subset of the memory cells (e.g., subset 2502 or 2602 in FIG. 25 or 26, respectively) to a common initial threshold voltage distribution (e.g., 1200) and to use the one or more successive program pulses to program a portion of the second subset of the memory cells (e.g., in the example of FIG. 16A-16D, the memory cells 2508-2510 or 2612-2618 in FIG. 25 or 26, respectively, or in the example of FIGS. 16E and 16F, the memory cells 2509-2510 or 2613-2618 in FIG. 25 or 26, respectively) from the common initial threshold voltage distribution to higher threshold voltage distributions (e.g., Vth distributions 1201-1203 in the example of FIG. 16A-16D or Vth distribution 1202 in the example of FIGS. 16E and 16F) than the common initial threshold voltage distribution.

In one approach, consistent with the example of FIG. 16A-16D, a number of program pulses in the first program pass (e.g., four program pulses) is equal to a number of data states in the higher data states (e.g., four data states D-G).

In another approach, consistent with the example of FIGS. 16E and 16F, a number of program pulses in the first program pass (e.g., two program pulses) is less than a number of data states in the higher data states (e.g., four data states D-G).

FIG. 16E depicts a Vth distribution of a set of memory cells after a first program pulse in the first pass of a two-pass program operation, in an Example 3B which is an alternative to Example 3A. As in FIG. 16A, the intermediate Vth distribution 1200 is obtained after a first program pulse without a verify test.

FIG. 16F depicts a Vth distribution of a set of memory cells after a second program pulse in the first pass of a two-pass program operation, in the Example 3B. The intermediate Vth distribution 1202 is obtained after a second program pulse without a verify test. The memory cells assigned to the F and G states are programmed to the intermediate Vth distribution 1202, while the memory cells assigned to the D and E states continue to be represented by the intermediate Vth distribution 1200. This can provide a simpler implementation compared to FIG. 16D.

The second program pass then proceeds as represented by FIGS. 13A and 13B.

FIG. 17A depicts a Vth distribution of a set of memory cells after a first program pulse in the first pass of a two-pass program operation, in an Example 4A, where eight data states are used. Consistent with the process of FIG. 11D, the memory cells assigned to the programmed data states (e.g., A-G) are programmed to different intermediate Vth distributions 1700-1706 in a first program pass using a single program pulse. The intermediate Vth distributions 1700-1706 are then programmed to the final Vth distributions 911-917, respectively, for memory cells assigned to the A-G states, respectively, in a second program pass, as depicted in FIG. 12B. There is a one-to-one mapping of the intermediate Vth distributions to the final Vth distributions.

This example is more complex than FIGS. 12A and 12B since there are seven intermediate Vth distributions instead of four. Also, seven different program-enable bit line voltages are used instead of four. An advantage is that the Vth increase between the first and second program passes is reduced for the lower data states as well as the higher data states, potentially further reducing NWI and charge loss.

FIG. 17B depicts a Vth distribution of a set of memory cells after a second pass of a two-pass program operation, in the Example 4A. There is a one-to-one mapping from the intermediate Vth distributions to the Vth distributions of the programmed data states.

The first program pass can be considered to provide a rough or foggy programming of the memory cells while the second program pass provides a fine programming of the memory cells.

FIG. 18A depicts a Vth distribution of a set of memory cells after a single program pulse in the first pass of a two-pass program operation, in an Example 4B which is an alternative to Example 4A. The memory cells assigned to the Er and A states remain in the Vth distribution 910 of the erased state. Using a single program pulse, the memory cells assigned to the B and C states, D and E states, and F and G states are programmed to the intermediate Vth distributions 1701, 1703 and 1705, respectively.

FIG. 18B depicts a Vth distribution of a set of memory cells after a second pass of a two-pass program operation, in the Example 4B. There is a one-to-two mapping. The Vth distribution 910 is mapped to a set of Vth distributions 1710 for the Er and A states. The Vth distribution 1701 is mapped to a set of Vth distributions 1711 for the B and C states. The Vth distribution 1703 is mapped to a set of Vth distributions 1712 for the D and E states. The Vth distribution 1705 is mapped to a set of Vth distributions 1713 for the F and G states.

FIG. 19A depicts a Vth distribution of a set of memory cells after a first program pulse in the first pass of a two-pass program operation, in an Example 5A, where eight data states are used. Consistent with the process of FIG. 11E, the memory cells assigned to the programmed data states (e.g., A-G) are programmed to the different intermediate Vth distributions 1700-1706 using successive program pulses. The memory cells assigned to the A-G states are programmed to the first intermediate Vth distribution 1700 using a first program pulse without a verify test.

FIG. 19B depicts a Vth distribution of a set of memory cells after a second program pulse in the first pass of a two-pass program operation, in the Example 5A. The memory cells assigned to the B-G states are programmed to the second intermediate Vth distribution 1701 using a second program pulse without a verify test, while the memory cells assigned to the A state continue to be represented by the first intermediate Vth distribution 1700.

FIG. 19C depicts a Vth distribution of a set of memory cells after a third program pulse in the first pass of a two-pass program operation, in the Example 5A. The memory cells assigned to the C-G states are programmed to the third intermediate Vth distribution 1702 using a third program pulse without a verify test, while the memory cells assigned to the A and B states continue to be represented by the intermediate Vth distributions 1700 and 1701, respectively.

FIG. 19D depicts a Vth distribution of a set of memory cells after a fourth program pulse in the first pass of a two-pass program operation, in the Example 5A. The memory cells assigned to the D-G states are programmed to the fourth intermediate Vth distribution 1703 using a fourth program pulse without a verify test, while the memory cells assigned to the A-C states continue to be represented by the intermediate Vth distributions 1700-1702, respectively.

FIG. 19E depicts a Vth distribution of a set of memory cells after a fifth program pulse in the first pass of a two-pass program operation, in the Example 5A. The memory cells assigned to the E-G states are programmed to the fifth intermediate Vth distribution 1704 using a fifth program pulse without a verify test, while the memory cells assigned to the A-D states continue to be represented by the intermediate Vth distributions 1700-1703, respectively.

FIG. 19F depicts a Vth distribution of a set of memory cells after a sixth program pulse in the first pass of a two-pass program operation, in the Example 5A. The memory cells assigned to the F and G states are programmed to the sixth intermediate Vth distribution 1705 using a sixth program pulse without a verify test, while the memory cells assigned to the A-E states continue to be represented by the intermediate Vth distributions 1700-1704, respectively.

FIG. 19G depicts a Vth distribution of a set of memory cells after a seventh program pulse in the first pass of a two-pass program operation, in the Example 5A. The memory cells assigned to the G state are programmed to the seventh intermediate Vth distribution 1706 using a seventh program pulse without a verify test, while the memory cells assigned to the A-F states continue to be represented by the intermediate Vth distributions 1700-1705, respectively.

In one embodiment, the first program pass comprises an initial program pulse and one or more successive program pulses after the initial program pulse. In the first program pass, a control circuit is configured to use the initial program pulse to program a first subset of the memory cells (e.g., memory cells assigned to the A state) and a second subset of the memory cells (e.g., memory cells assigned to the B-G states) to a common initial threshold voltage distribution 1700 and to use the one or more successive program pulses to program the second subset of the memory cells from the common initial threshold voltage distribution to one or more higher threshold voltage distributions (e.g., Vth distributions 1701-1703) than the common initial threshold voltage distribution.

FIG. 20A depicts a Vth distribution of a set of memory cells after a first program pulse in the first pass of a two-pass program operation, in an Example 5B as an alternative to Example 5A, where eight data states are used. The memory cells assigned to the B-G states are programmed to the intermediate Vth distribution 1701 using a first program pulse without a verify test. The memory cells assigned to the Er and A states continue to be represented by the Vth distribution 910.

FIG. 20B depicts a Vth distribution of a set of memory cells after a second program pulse in the first pass of a two-pass program operation, in the Example 5B. The memory cells assigned to the D-G states are programmed to the intermediate Vth distribution 1703 using a second program pulse without a verify test, while the memory cells assigned to the Er and A states, and the B and C states continue to be represented by the Vth distributions 910 and 1701, respectively.

FIG. 20C depicts a Vth distribution of a set of memory cells after a third program pulse in the first pass of a two-pass program operation, in the Example 5B. The memory cells assigned to the F and G states are programmed to the intermediate Vth distribution 1705 using a second program pulse without a verify test, while the memory cells assigned to the Er and A states, the B and C state, and the D and E states continue to be represented by the distributions 910, 1701 and 1703, respectively.

FIG. 21A depicts a Vth distribution of a set of memory cells after a first program pulse in the first pass of a two-pass program operation, in an Example 6, where eight data states are used. In this example, a single program pulse is applied while a program-enable bit line voltage is applied for the memory cells assigned to lower data states such as the A-D states and a program-inhibit bit line voltage is applied for the memory cells assigned to the higher data states such as the E-G states. The memory cells assigned to the A, B and C states are programmed to the intermediate Vth distributions 1700, 1701 and 1702, respectively, while the memory cells assigned to the D-G states are programmed to the intermediate Vth distribution 1703.

FIG. 21B depicts a Vth distribution of a set of memory cells after a second program pulse in the first pass of a two-pass program operation, in the Example 6. The memory cells assigned to the E, F and G states are programmed to the intermediate Vth distributions 1704, 1705 and 1706, respectively, while the memory cells assigned to the D states remain in the intermediate Vth distribution 1703.

The second pass can be performed as depicted in FIG. 17B.

This approach saves time since two program pulses are used without a verify test. Additionally, the bit line voltages and program pulse magnitude and/or duration can be more easily optimized. This approach also can avoid the problem of the magnitude of the bit line voltage being limited by the window of the SGD transistors. In particular, the programming of FIG. 17A, for example, may not be possible if the peak Vbl is too high based on the magnitude and duration of the single program pulse. With the approach of Example 6, in contrast, the program pulse magnitude and duration can be optimized separately for the first and second program pulses, to reduce the peak Vbl.

In one embodiment, a first subset (2501, 2601) of the set of memory cells is configured to be programmed to lower data states of a set of data states (A-C or S1-S7), a second subset (2502, 2602) of the set of memory cells is configured to be programmed to higher data states (D-G or S8-S15) of the set of data states, and one or more program pulses of a first program pass comprise a first program pulse (2201 or 2211) used to program the memory cells configured to be programmed to the lower data states and a second program pulse (2202, 2212) used to program the memory cells configured to be programmed to the higher data states.

In an option to Example 6, the intermediate Vth distributions 1703-1706 are obtained by applying the first program pulse while the intermediate Vth distributions 1700-1702 are obtained by applying the second program pulse. Other variations are possible as well.

FIG. 22A depicts an example program voltage signal for use in the example of FIG. 12A. The voltage signal 2200 includes program pulses 2201, 2202, 2203 and 2204 with progressively larger durations pd1, pd2, pd3 and pd4, respectively. The program pulses have a fixed peak magnitude of Vpgm.

FIG. 22B depicts another example program voltage signal for use in the example of FIG. 12A. The voltage signal 2210 includes program pulses 2211, 2212, 2213 and 2214 with progressively larger durations pd1, pd2, pd3 and pd4, respectively, and progressively larger magnitudes Vpgm1, Vpgm2, Vpgm3 and Vpgm4, respectively. As mentioned, the program pulse magnitude and/or duration can be optimized to achieve the desired intermediate Vth distributions. When multiple program pulses are used in the first program pass, the program-enable bit line voltage can be set at a fixed level such as 0 V in one possible approach.

In contrast, when a single program pulse is used in the first program pass, different program-enable bit line voltages can be set such as depicted in FIG. 23A at voltage signals 2330 and 2340. The program-enable bit line voltages can be optimized to achieve the desired intermediate Vth distributions, along with the optimization of the magnitude and/or duration of the single program pulse.

FIG. 23A depicts example voltage signals which can be used in the first pass of a program operation, consistent with FIG. 11A. The period of time depicted corresponds to a single program pulse. The vertical dimension denotes voltage and the horizontal dimension denotes time, with time points t0-t6. A voltage signal 2300 represents Vwl_sel, the voltage of the selected word line, a voltage signal 2310 represents Vwl_unsel, a voltage of unselected word lines, a voltage signal 2320 represents the select gate voltages, e.g., Vsgd and/or Vsgs, and the voltage signals 2330 and 2340 represents first and second examples, respectively, of different bit line voltages (Vbl).

Vwl_sel is at an initial voltage such as 0 V, then increases from the initial voltage to Vpass starting at t2, and is held at Vpass from t3-t4. Vwl_sel then increases from Vpass to Vpgm starting at t4, and is held at a peak voltage Vpgm until t6. Vwl_sel then decreases from Vpgm back to the initial voltage at t6 and is held at the initial voltage.

Vwl_unsel increases to Vpass and is held at that level throughout the duration of the program pulse.

The voltage signal 2320 represents the select gate voltages including the select gate voltage Vsg_sel for a selected sub-block (plot 2321) and the select gate voltage Vsg_unsel for an unselected sub-block (plot 2322). During the program pulse, Vsg_sel and Vsg_unsel can be set to, e.g., 2.5 V and 0 V, respectively.

The voltage signal 2330 represents a program-inhibit bit line voltage, Vbl_inh, such as 2 V (plot 2336). Different program-enable bit line voltages of 0 V, 0.25 V, 0.5 V, and 0.75 V are depicted by plots 2331-2334, respectively.

The voltage signal 2340 represents the program-inhibit bit line voltage (plot 2348). Different program-enable bit line voltages of 0 V, 0.2 V, 0.4 V, 0.6 V, 0.8 V, 1.0 V and 1.2 V are depicted by plots 2341-2347, respectively.

The pre-charge phase of FIG. 23B could also be used before each program pulse in the first pass.

FIG. 23B depicts example voltage signals which can be used in the second pass of a program operation, consistent with FIG. 11A. In this example, the program loop includes a pre-charge phase 2351, a program phase 2352 in which a program pulse is applied, and a verify phase 2353 in which verify tests are performed. The vertical dimension denotes voltage and the horizontal dimension denotes time, with time points t0-t11. A voltage signal 2350 represents Vwl_sel, a voltage signal 2360 represents Vwl_unsel, a voltage signal 2370 represents the select gate voltages, and the voltage signal 2380 represents bit line voltage.

In the pre-charge phase, a positive Vbl, e.g., 2 V, is provided to the drain-side of the channels of the NAND strings to remove residue electrons and to provide a small amount of boosting such as 1-2 V. The SGD transistors of the selected and unselected sub-blocks are in a conductive state at this time, with a voltage of 6 V, for example. This allows the bit line voltage to be passed to the drain end of the channel. The SGS transistors of the selected and unselected sub-blocks may also be in a conductive state at this time, with a voltage of 6 V, for example, to allow the source line voltage (Vsl) to be passed to the source end of the channel.

The program phase was discussed in connection with FIG. 23A. Vg_sel and Vsg_unsel can be set to 2.5 V and 0 V, respectively, as depicted by plots 2371 and 2372, respectively. A program-inhibit bit line voltage, Vbl_inh, such as 2 V (plot 2381) can be set for the NAND strings in which programming is to be inhibited, while a program-enable bit line voltage of 0 V (plot 2382) is also set for the NAND strings in which programming is to be enabled.

In the verify phase, verify tests are performed when a verification signal 2354 is applied to the selected word line. In this example, the verification signal includes the verify voltage VvA from t9-t10 and the verify voltage VvB from t10-t11. During the application of VvA and VvB, the memory cells assigned to the A and B states, respectively, are sensed to determine if they are in a conductive or non-conductive state.

FIG. 24 depicts example values in the latches of FIG. 2 during a program operation. A 0 or 1 bit is depicted for each of the latches UDL, MDL and LDL. Each column indicates a different configuration or sequence of bits of the latches for each assigned data state. The column titled Er/Inhibit indicates that, for memory cells which are assigned to the erased state or which are inhibited from programming, the latches have all 1's. The UDL, MDL and LDL latches together provide a sequence of 3 bits which identify the assigned data state of a memory cell. When a memory cell is inhibited from programming, any UDL, MDL and LDL latches with 0 are flipped to 1. By reading the latches, the assigned data state of each selected memory cell can be determined and a corresponding bit line voltage can be set during a program pulse.

FIG. 25 depicts an example set of memory cells connected to a word line selected for programming, where eight data states are used. This simplified example includes 32 memory cells, with 4 memory cells of each of 8 assigned data states. Although the data states are typically randomly distributed among the memory cells, memory cells with a common assigned data state are grouped in this example for simplicity. Each memory cell is represented by a square and the assigned data state (Er-G) is represented by a letter inside the square.

The set 2500 may represent a plurality of memory cells connected to a word line. The plurality of memory cells are configured to store data in a set of data states Er-G. Subsets 2503-2510 of the set 2500 represent memory cells assigned to the Er-G states, respectively. Additionally, a subset 2501 represents memory cells which are configured to be programmed to lower data states among the set of data states, and a subset 2502 represents memory cells which are configured to be programmed to higher data states among the set of data states.

FIG. 26 depicts an example set of memory cells connected to a word line selected for programming, where sixteen data states are used. This example includes 32 memory cells, with 2 memory cells of each of 16 assigned data states. Each memory cell is represented by a square and the assigned data state (S0-S15) is represented by a letter inside the square.

The set 2600 may represent a plurality of memory cells connected to a word line. The plurality of memory cells are configured to store data in a set of data states S0-S15. Subsets 2603-2618 of the set 2600 represent memory cells assigned to the S0-S15 states, respectively. Additionally, a subset 2601 represents memory cells which are configured to be programmed to lower data states among the set of data states, and a subset 2602 represents memory cells which are configured to be programmed to higher data states among the set of data states.

In one implementation, an apparatus comprises: a set of memory cells connected to a word line, each memory cell is in a respective NAND string, the respective NAND strings are connected to a set of bit lines, a first subset of the set of memory cells is configured to be programmed to lower data states of a set of data states and a second subset of the set of memory cells is configured to be programmed to higher data states of the set of data states; and a control circuit, the control circuit, to perform a first program pass of a program operation in which the second subset of the set of memory cells is programmed, is configured to apply one or more program pulses to the word line without performing verify tests for the second subset of the set of memory cells, and to perform a second program pass of the program operation in which the first subset of the set of memory cells and the second subset of the set of memory cells are programmed, is configured to apply a set of program pulses to the word line and perform verify tests for the first subset of the set of memory cells and the second subset of the set of memory cells.

In another implementation, a method comprises: performing a first program pass of a program operation for a set of memory cells connected to a word line, wherein each memory cell is in a respective NAND string, the respective NAND strings are connected to respective bit lines, the programming in the first program pass comprises applying a program pulse to the word line while setting different program-enable voltages on some of the respective bit lines and not applying a verify voltage to the word line; and performing a second program pass of the program operation by performing a plurality of program loops, wherein each program loop is performed by applying a program pulse followed by a verify voltage to the word line.

In another implementation, an apparatus comprises: a set of memory cells connected to a word line, each memory cell is in a respective NAND string, the respective NAND strings are connected to a set of bit lines; and a control circuit. The control circuit, to perform a first program pass of a program operation is configured to: apply a first set of program pulses to the word line without performing verify tests for the memory cells, while applying a program-inhibit voltage to respective bit lines for progressively larger portions of the memory cells and applying a program-enable voltage to respective bit lines for progressively smaller portions of the memory cells over the first set of program pulses; and to perform a second program pass of the program operation, the control circuit is configured to apply a second set of program pulses to the word line and to perform verify tests after each program pulse of the second set of program pulses.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   a set of memory cells connected to a word line, each memory cell is in a respective NAND string, the respective NAND strings are connected to a set of bit lines, a first subset of the set of memory cells is configured to be assigned to a lower half of a set of data states and a second subset of the set of memory cells is configured to be assigned to an upper half of the set of data states, verify voltages of the lower half of the set of data states are lower than verify voltages of the upper half of the set of data states, the lower half of the set of data states comprises an erased data state; and
   a control circuit connected to the set of memory cells, the control circuit is configured to:
      perform a first program pass of a program operation in which the second subset of the set of memory cells is programmed while the first subset of the set of memory cells is inhibited from programming and remains in the erased data state, wherein to perform the first program pass, the control circuit is configured to apply one or more program pulses to the word line without performing a verify test for the second subset of the set of memory cells; and
      perform a second program pass of the program operation in which the first subset of the set of memory cells and the second subset of the set of memory cells are programmed, wherein to perform the second program pass, the control circuit is configured to apply a set of program pulses to the word line and perform verify tests for the first subset of the set of memory cells and the second subset of the set of memory cells after each program pulse of the set of program pulses.

2. The apparatus of claim 1, wherein:
   during a single program pulse of the one or more program pulses of the first program pass, the control circuit is configured to apply different program-enable voltages to respective bit lines of the second subset of the set of memory cells according to different assigned data states of the upper half of the set of data states and to apply a program-inhibit voltage to respective bit lines of the first subset of the set of memory cells.

3. The apparatus of claim 2, wherein:
   the different program-enable voltages are highest for a lowest data state among the upper half of the set of data states and lowest for a highest data state among the upper half of the set of higher data states.

4. The apparatus of claim 1, wherein:
   the one or more program pulses of the first program pass comprise an initial program pulse and one or more successive program pulses after the initial program pulse; and
   in the first program pass, the control circuit is configured to use the initial program pulse to program the second subset of the set of memory cells to a common initial threshold voltage distribution and to use the one or more successive program pulses to program a portion of the second subset of the set of memory cells from the common initial threshold voltage distribution to one or more higher threshold voltage distributions than the common initial threshold voltage distribution.

5. The apparatus of claim 4, wherein:
a number of program pulses in the one or more program pulses of the first program pass is equal to a number of data states in the upper half of the set of data states.

6. The apparatus of claim 4, wherein:
a number of program pulses in the one or more program pulses of the first program pass is less than a number of data states in the upper half of the set of data states.

7. The apparatus of claim 2, wherein:
a number of program-enable voltages in the different program-enable voltages is less than a number of data states in the upper half of the set of data states.

8. The apparatus of claim 1, wherein:
the set of data states comprises at least eight data states.

9. An apparatus, comprising:
a control circuit connected to a set of memory cells, the set of memory cells is connected to a word line, each memory cell is in a respective NAND string, the respective NAND strings are connected to a set of bit lines, and the control circuit is configured to:
assign a first subset of the set of memory cells to a lower half of a set of data states and a second subset of the set of memory cells to an upper half of the set of data states, wherein verify voltages of the lower half of the set of data states are lower than verify voltages of the upper half of the set of data states, and the lower half of the set of data states comprises an erased data state;
perform a first program pass of a program operation in which the second subset of the set of memory cells is programmed while the first subset of the set of memory cells is inhibited from programming and remains in the erased data state, wherein to perform the first program pass, the control circuit is configured to apply one or more program pulses to the word line without performing a verify test for the second subset of the set of memory cells; and
perform a second program pass of the program operation in which the first subset of the set of memory cells and the second subset of the set of memory cells are programmed, wherein to perform the second program pass, the control circuit is configured to apply a set of program pulses to the word line and perform verify tests for the first subset of the set of memory cells and the second subset of the set of memory cells after each program pulse of the set of program pulses.

10. The apparatus of claim 9, wherein:
during a single program pulse of the one or more program pulses of the first program pass, the control circuit is configured to apply different program-enable voltages to respective bit lines of the second subset of the set of memory cells according to different assigned data states of the upper half of the set of data states and to apply a program-inhibit voltage to respective bit lines of the first subset of the set of memory cells.

11. The apparatus of claim 10, wherein:
the different program-enable voltages are highest for a lowest data state among the upper half of the set of data states and lowest for a highest data state among the upper half of the set of data states.

12. The apparatus of claim 9, wherein:
the one or more program pulses of the first program pass comprise an initial program pulse and one or more successive program pulses after the initial program pulse; and
in the first program pass, the control circuit is configured to use the initial program pulse to program the second subset of the set of memory cells to a common initial threshold voltage distribution and to use the one or more successive program pulses to program a portion of the second subset of the set of memory cells from the common initial threshold voltage distribution to one or more higher threshold voltage distributions than the common initial threshold voltage distribution.

13. The apparatus of claim 12, wherein:
a number of program pulses in the one or more program pulses of the first program pass is equal to a number of data states in the upper half of the set of data states.

14. The apparatus of claim 12, wherein:
a number of program pulses in the one or more program pulses of the first program pass is less than a number of data states in the upper half of the set of data states.

15. The apparatus of claim 10, wherein:
a number of program-enable voltages in the different program-enable voltages is less than a number of data states in the upper half of the set of data states.

16. The apparatus of claim 9, wherein:
the set of data states comprises at least eight data states.

* * * * *